(12) United States Patent
Chen et al.

(10) Patent No.: US 10,840,153 B2
(45) Date of Patent: Nov. 17, 2020

(54) NOTCHED GATE STRUCTURE FABRICATION

(71) Applicant: Taiwan Semiconductor Manufacturing Co., Ltd., Hsin-Chu (TW)

(72) Inventors: Chang-Yin Chen, Taipei (TW); Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 57 days.

(21) Appl. No.: 16/161,833

(22) Filed: Oct. 16, 2018

(65) Prior Publication Data
US 2020/0006148 A1 Jan. 2, 2020

Related U.S. Application Data

(60) Provisional application No. 62/690,697, filed on Jun. 27, 2018.

(51) Int. Cl.
| | |
|---|---|
| *H01L 21/8238* | (2006.01) |
| *H01L 29/51* | (2006.01) |
| *H01L 29/49* | (2006.01) |
| *H01L 21/308* | (2006.01) |
| *H01L 27/092* | (2006.01) |
| *H01L 21/3065* | (2006.01) |
| *H01L 29/66* | (2006.01) |
| *H01L 29/10* | (2006.01) |
| *H01L 21/306* | (2006.01) |

(52) U.S. Cl.
CPC .... *H01L 21/82385* (2013.01); *H01L 21/3065* (2013.01); *H01L 21/3086* (2013.01); *H01L 21/30608* (2013.01); *H01L 21/823814* (2013.01); *H01L 21/823821* (2013.01); *H01L 27/0924* (2013.01); *H01L 29/1033* (2013.01); *H01L 29/4966* (2013.01); *H01L 29/517* (2013.01); *H01L 29/66545* (2013.01); *H01L 29/66553* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |

(Continued)

*Primary Examiner* — Robert G Bachner
*Assistant Examiner* — Molly K Reida
(74) *Attorney, Agent, or Firm* — Haynes and Boone, LLP

(57) ABSTRACT

A method includes providing a structure having a first region and a second region, the first region including a first channel region, the second region including a second channel region; forming a gate stack layer over the first and second regions; patterning the gate stack layer, thereby forming a first gate stack over the first channel region and a second gate stack over the second channel region; and laterally etching bottom portions of the first and second gate stacks by applying different etchant concentrations to the first and second regions simultaneously, thereby forming notches at the bottom portions of the first and second gate stacks.

20 Claims, 20 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2016/0093537 A1* | 3/2016 | Chen ............... H01L 21/823431 438/283 |
| 2016/0133696 A1* | 5/2016 | Yin .................. H01L 29/66537 257/402 |

* cited by examiner

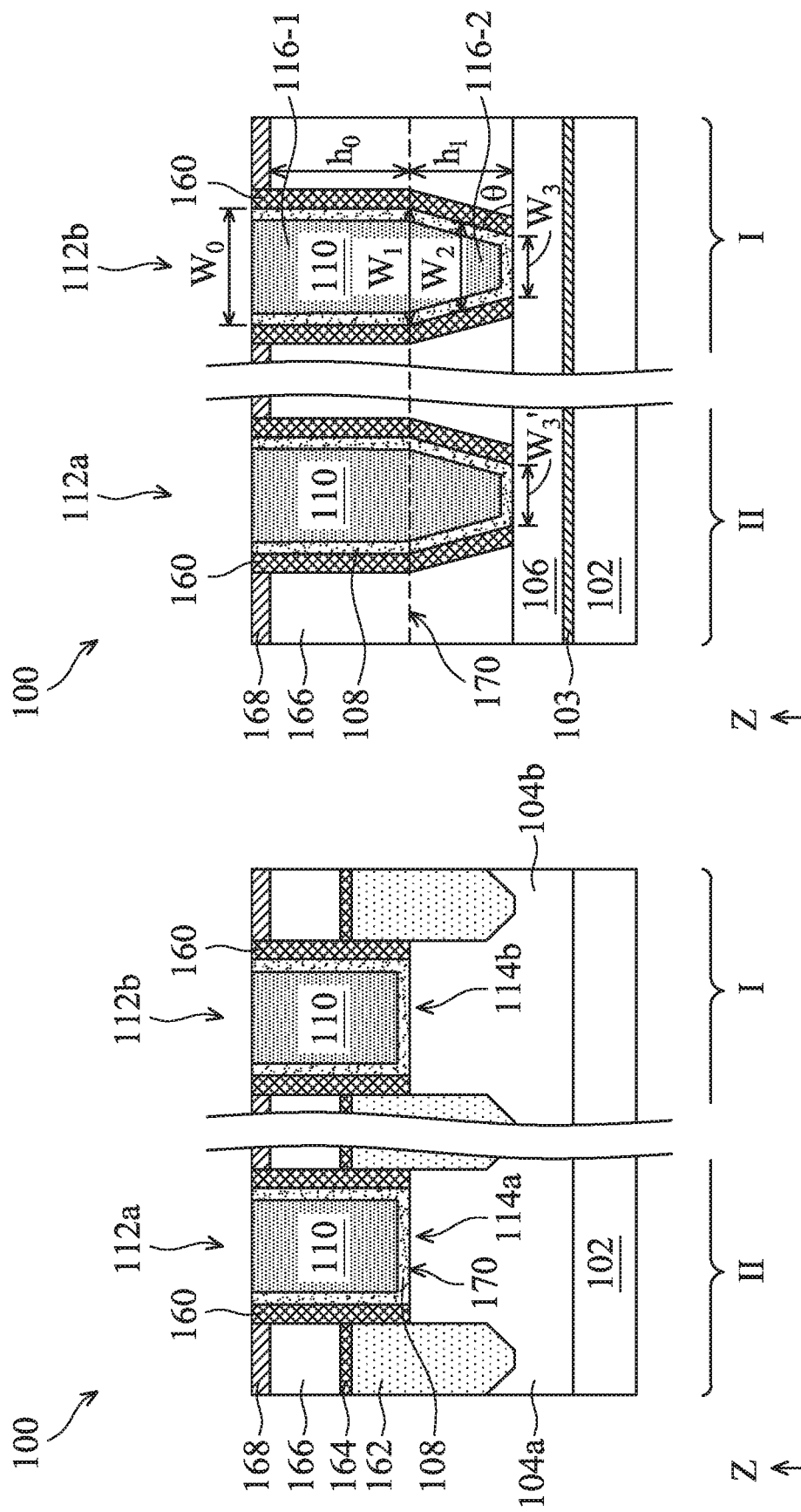

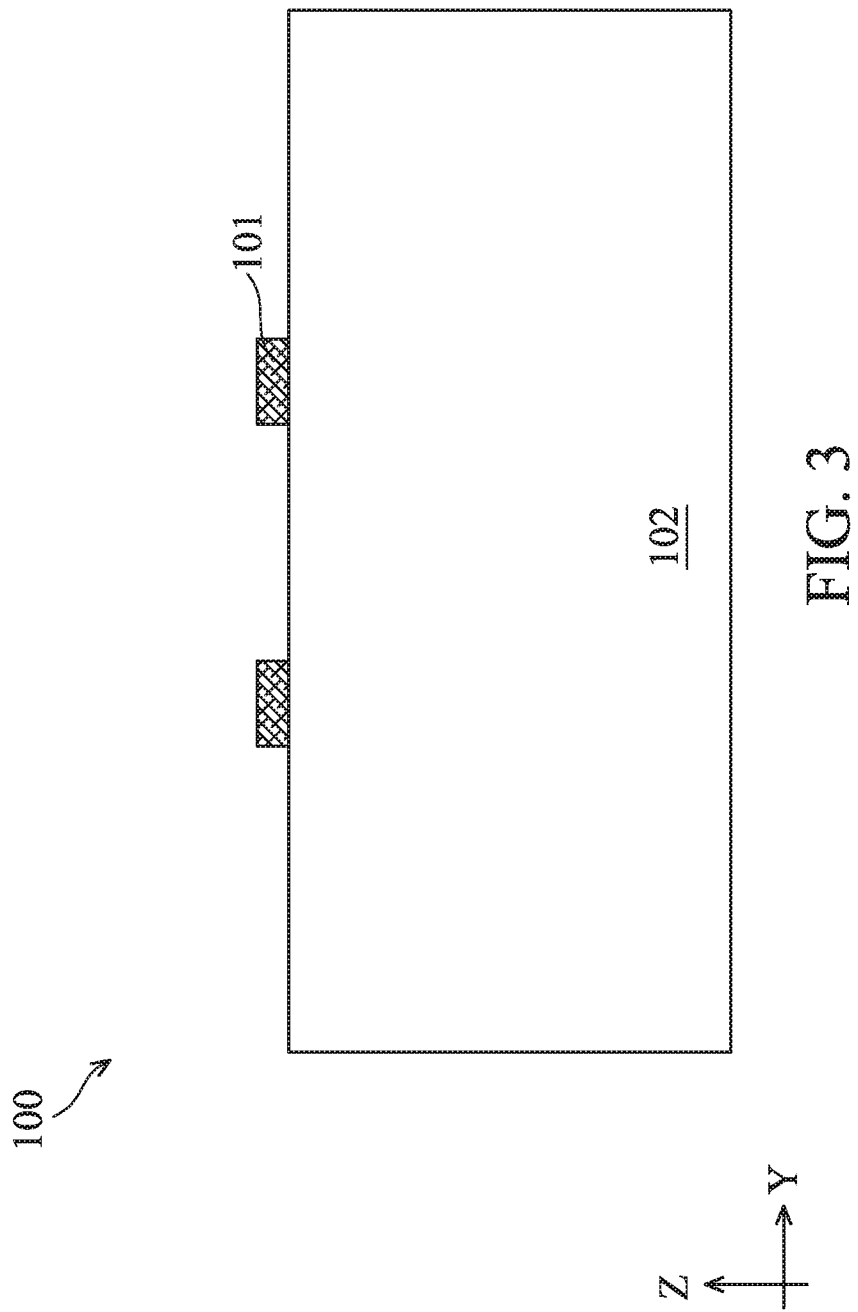

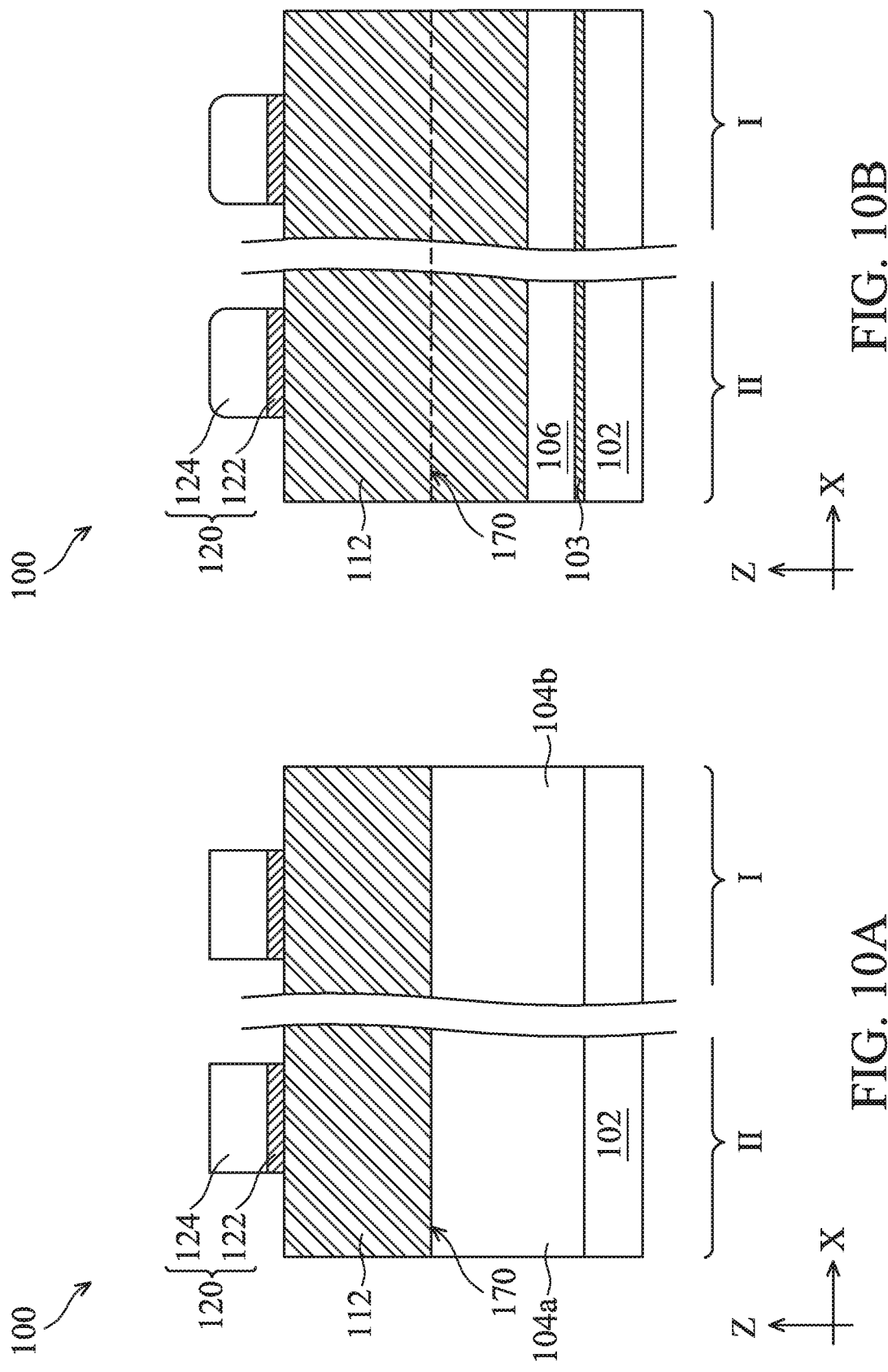

NOTCHED GATE STRUCTURE FABRICATION

PRIORITY DATA

This application claims priority to U.S. Provisional Patent Application Ser. No. 62/690,697 filed on Jun. 27, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of a notched gate structure that has notched sidewalls at its bottom instead of substantially vertical sidewalls. One of the benefits of the notched gate structure is its enlarging the distance between bottoms of adjacent gate structures, which effectively mitigates metal gate protrusion during a replacement gate or "gate-last" process. However, there are challenges to maintain the uniformity of notched gate structure profiles across a wafer. For example, a gate patterning process may generate an etch rate difference and a critical dimension (CD) bias between a center region and an edge region of a wafer, causing not only a center-to-edge gate structure dimension variation but also greatly deteriorating a chip yield in an edge region. Although existing approaches in notched gate structure formation have been generally adequate for their intended purposes, they have not been entirely satisfactory in all respects. Accordingly, there exists a need for improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1B, 1C, and 1D show cross-sectional views of the semiconductor structure in FIG. 1A, in accordance with an embodiment.

FIGS. 3, 4, 5, 6, 7, 8, 9, 10A, 10B, 12A, 12B, 13A, 13B, 14A, 14B, 15A, 15B, 16A, and 16B illustrate cross-sectional views of a semiconductor structure during a fabrication process according to the method of FIGS. 2A-2B, in accordance with an embodiment.

DETAILED DESCRIPTION

Figure 1A:
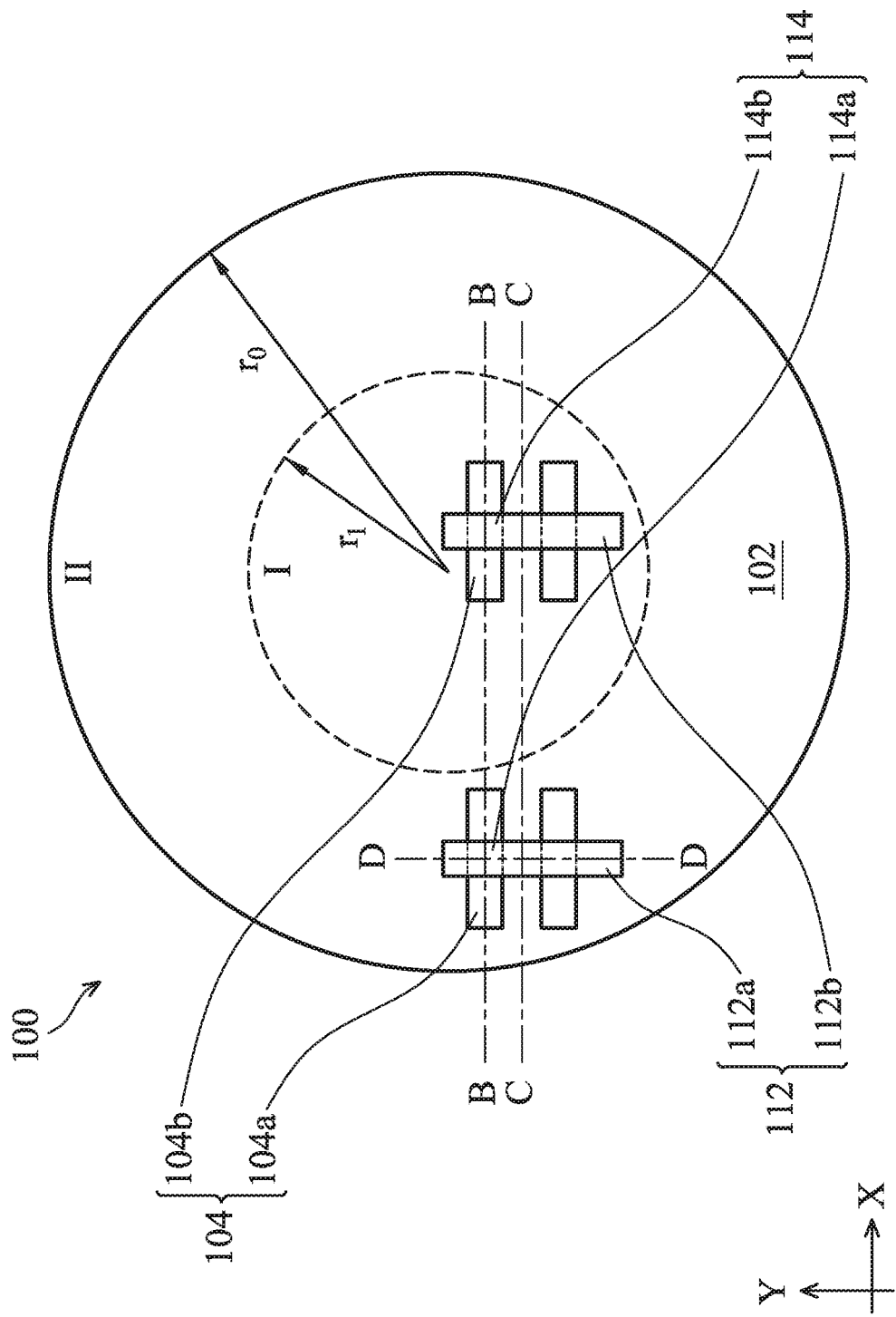
FIG. 1A shows a top view of a semiconductor structure with transistors formed in different regions with a notched gate structure fabrication process, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods. More particularly, the present disclosure is related to providing a notched gate structure and a gate fabrication technique that maintains the uniformity of notched gate structure profile at a wafer scale. In the forming of field effect transistors (FETs), the critical dimension (CD) of gate stacks affects many operating parameters of integrated circuits, such as speed performance and power consumption of a circuit. There is also a concern that the diminishing CD and closer base distances between adjacent gate stacks may aggravate device shorting caused by metal material leakage from a defect gate stack during a replacement gate or "gate-last" process, termed as "metal gate protrusion." Notched gate structure has been developed as a way to reduce the chance of metal gate protrusion from occurring. Besides, the notched gate structure reduces effective gate stack CDs and enlarges distance from the bottom of a gate stack to other FETs features, therefore mitigating possible shorting caused by metal gate protrusion. In some cases, different regions of a wafer suffer from etch rate differences and CD bias across the wafer during notched gate structure formation. As an example, gate stack structures in edge regions of a wafer are sometimes found under etched at the bottom of gate stacks, while the ones in center regions are sometimes found over etched. This might cause circuit defects and chip yield deterioration. An object of the present disclosure is to maintain the uniformity of notched gate structure profile across the whole wafer by applying different etch rates to different regions of the wafer during the notched gate structure formation.

Figure 1D:
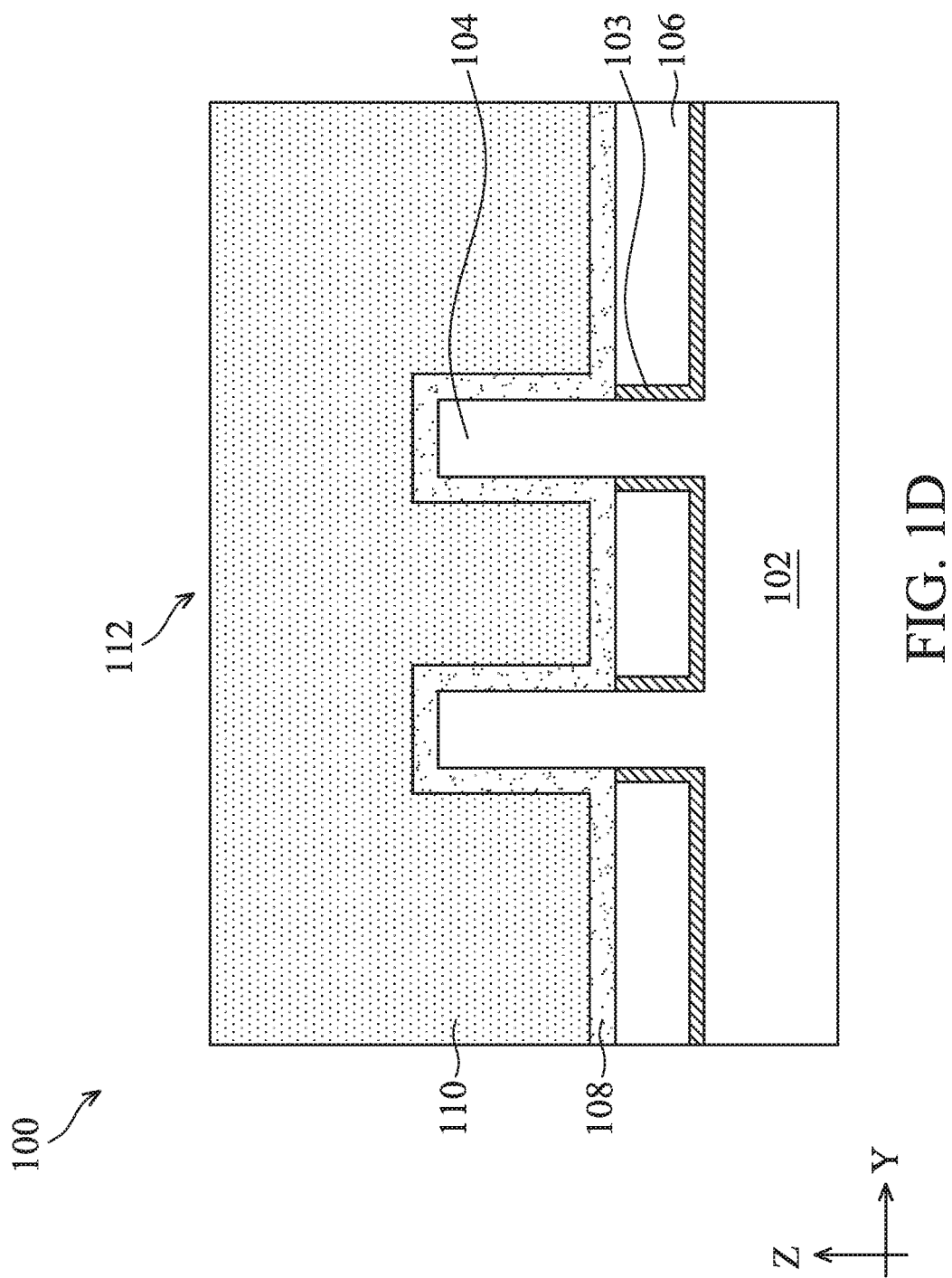

FIG. 1A illustrates a top view of a semiconductor device (or semiconductor structure) 100. FIG. 1B illustrates a cross-sectional view of the device 100 along the B-B line of FIG. 1A. FIG. 1C illustrates a cross-sectional view of the device 100 along the C-C line of FIG. 1A. FIG. 1D illustrates a cross-sectional view of the device 100 along the D-D line of FIG. 1A.

Referring to FIG. 1A, the device 100 can be a wafer, part of a wafer, or a substrate with fabricated features thereon. In the illustrated embodiment, the device 100 is a semiconductor wafer (e.g., a silicon wafer). A wafer usually exhibits a disk shape with a radius $r_0$. The diameter ($2r_0$) of the disk may range from Ø-200 mm (Ø-8 inch) to Ø-450 mm (Ø-18 inch), such as a Ø-300 mm (Ø-12 inch) wafer in a specific example. From a top view, the device 100 can be divided into multiple regions, such as edge regions and center regions, depending on a distance to a center of the device 100. In the illustrated embodiment, the device 100 is divided into a center region I within radius $r_1$ and an edge region (or peripheral region) II outside of radius $r_1$. In a furtherance of the embodiment, $r_1$ is about 71% of $r_0$, resulting in the region I and region II having substantially equal areas from a top view.

The device 100 may be an intermediate device fabricated during processing of an integrated circuit (IC) that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

In the illustrated embodiment, the device 100 includes a substrate 102, a plurality of fins 104 protruding out of the substrate 102 including the fin 104a in the edge region II and the fin 104b in the center region I, and a plurality of gate structures 112 disposed over the fins 104 including the gate stack 112a over the fin 104a and the gate stack 112b over the fin 104b. In some embodiments, the gate structures 112 are also referred to as gate stacks 112 or gate stack layers 112. The fins 104 are arranged lengthwise along the X direction, and the gate stacks 112 are arranged lengthwise along the Y direction which is generally perpendicular to the X direction. Further, the fins 104 are generally parallel to each other, and the gate stack 112 are generally parallel to each other. Each portion of the gate stacks 112 engages the respective fins 104 to form individual field effect transistors (FET), which includes a channel region 114 inside the fin 104 and covered by the gate structure 112, such as the channel region 114a in the edge region II and the channel region 114b in the center region I.

Referring to FIGS. 1B, 1C, and 1D collectively, the device 100 may further include a dielectric liner layer 103 on sidewalls of the fins 104, an isolation structure 106 over the substrate 102 and between the fins 104, gate spacers 160 on sidewalls of the gate stack 112, and an interlayer dielectric (ILD) layer 166. Each gate stack 112 includes a high-k dielectric layer 108 and a conductive layer 110 over the high-k dielectric layer 108. The conductive layer 110 includes one or more layers of metallic materials. Therefore, each gate stack 112 is also referred to as a high-k metal gate (or HK MG) 112. The gate stacks 112 may further include an interfacial layer (not shown) under the high-k dielectric layer 108. Each gate stack 112 is disposed over the top surface 170 of the respective fin 104 and covers its sidewalls. The bottom of the gate stack 112 is also laying above the isolation structure 106.

Referring to FIG. 1C, the gate stack 112 has a portion above the top surface 170 of the fin 104, denoted as the upper portion 116-1, and a portion below the top surface 170 of the fin 104, denoted as the lower portion 116-2. In some embodiments, the upper portion 116-1 is also referred to as a top portion 116-1, and the lower portion 116-2 is also referred to as a bottom portion 116-2. The position of the top surface 170 of the fin 104 is marked by a dashed line in FIG. 1C for the sake of clarity in the comparisons. The top portion 116-1 has a top width $w_0$ and a bottom width $w_1$. The top width $w_0$ is larger than or at least equal to the bottom width $w_1$ in various embodiments. In the illustrated embodiment, the top portion 116-1 has substantially vertical sidewalls; therefore, the widths $w_0$ and $w_1$ are about the same, ranging from about 16 nm to about 240 nm, such as about 145 nm. Contrastively, the lower portion 116-2 has sidewalls titled inwardly. A tilted sidewall and the top surface of the isolation structure 106 (as well as the top surface of the substrate 102) form an angle θ ranging from about 45 degrees to about 85 degrees in some embodiments, such as about 80 degrees. The top portion 116-1 has a height $h_0$ ranging from about 20 nm to about 500 nm in some embodiments. The bottom portion 116-2 has a height $h_1$, which is less than $h_0$ ($h_1 < h_0$) in some embodiments. In the illustrated embodiment, $h_1$ is smaller than 50 nm. The bottom width $w_1$ of the top portion 116-1 is also the top width of the bottom portion 116-2. The middle width $w_2$ of the bottom portion 116-2 is measured at half height of $h_1$ ($h_1/2$). In various embodiments, $w_2$ is smaller than $w_1$ by about 0.1 nm to about 15 nm. The bottom width $w_3$ of the bottom portion 116-2 is further shrunk, such as smaller than $w_1$ by about 0.1 nm to about 30 nm. In a specific example, $w_0$ and $w_1$ are both about 145 nm, $w_2$ is about 141 nm (about 4 nm less than $w_1$), and $w_3$ is about 137 nm (about 8 nm less than $w_1$). In another example, $w_3$ is about 10% to about 100% of $w_1$. The gate stack 112 has a smaller effective CD in the lower portion 116-2 than in the upper portion 116-1. The tilted sidewalls surround the gate stack 112's notched portion. In the illustrated embodiment, the sidewall of the gate stack 112 starts being notched inwardly at about the same height of the top surface 170 of the fin 104. While in some other embodiments, the sidewalls of the gate stack 112 may start being notched inwardly above or below the top surface 170 of the fin 104. It is sometimes found that the bottom width $w_3$ of the lower portion 116-2 suffers a large variation across the wafer. For example, a bottom width $w_3'$ in the edge region II may be equal to or upto about 50% larger than a bottom width $w_3$ in the center region I. In some examples, in the edge region II, a bottom width $w_3'$ may be even larger than a width $w_1$ measured at the height $h_1$, a scenario in which a metal gate protrusion would be relatively easier to occur. The notched gate structure fabrication method to be discussed in further details later on can effectively maintain the uniformity of the bottom width $w_3$ across different regions of the wafer.

Referring again to FIGS. 1B, 1C, and 1D collectively, the components of the device 100 are further described below. The substrate 102 is a silicon substrate in the present embodiment. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 102 includes indium tin oxide (ITO) glass.

The fins 104 may comprise one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In an embodiment, the fins 104 may include alternately stacked layers of two different semiconductor materials, such as layers of silicon and silicon germanium alternately stacked. The fins 104 may additionally include dopants for improving the performance of the device 100. For example, the fins 104 may include n-type dopant(s) such as phosphorus or arsenic, or p-type dopant(s) such as boron or indium.

The liner layer 103 may include silicon nitride (e.g., $Si_3N_4$), and may be deposited using chemical vapor deposition (CVD) such as low-pressure CVD (LPCVD) or plasma-enhanced CVD (PECVD), atomic layer deposition (ALD), or other suitable methods.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features. The isolation structure 106 may be deposited using CVD such as flowable CVD, or other suitable methods.

The high-k dielectric layer 108 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 108 may be deposited using CVD, ALD and/or other suitable methods.

The conductive layer 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 110 may be deposited using methods such as CVD, PVD, plating, and/or other suitable processes.

The gate spacers 160 may comprise a dielectric material, such as silicon oxide, silicon nitride, silicon oxynitride, silicon carbide, other dielectric material, or combinations thereof, and may comprise one or multiple layers of material. The gate spacers 160 may be deposited using CVD, ALD and/or other suitable methods.

The ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD (plasma enhanced CVD), FCVD (flowable CVD), or other suitable methods.

The device 100 further includes source/drain (S/D) features 162 disposed over the fins 104. Generally, S/D features 162 are disposed on each of the fins 104 in their respective S/D regions. In one embodiment, the S/D features 162 disposed on the fin 104a include p-type doped silicon germanium, and the S/D features 162 disposed on the fin 104b include n-type doped silicon.

The device 100 further includes one or more dielectric layers, such as a protective dielectric layer 168 which may comprise a nitride such as silicon nitride for protecting the ILD layer 166, and a contact etch stop layer (CESL) 164 disposed over the S/D features 162. The CESL 164 may also be disposed over the isolation structure 106. The CESL 164 may comprise silicon nitride, silicon oxynitride, silicon nitride with oxygen (O) or carbon (C) elements, and/or other materials; and may be formed by CVD, PVD, ALD, or other suitable methods.

Figure 2A:
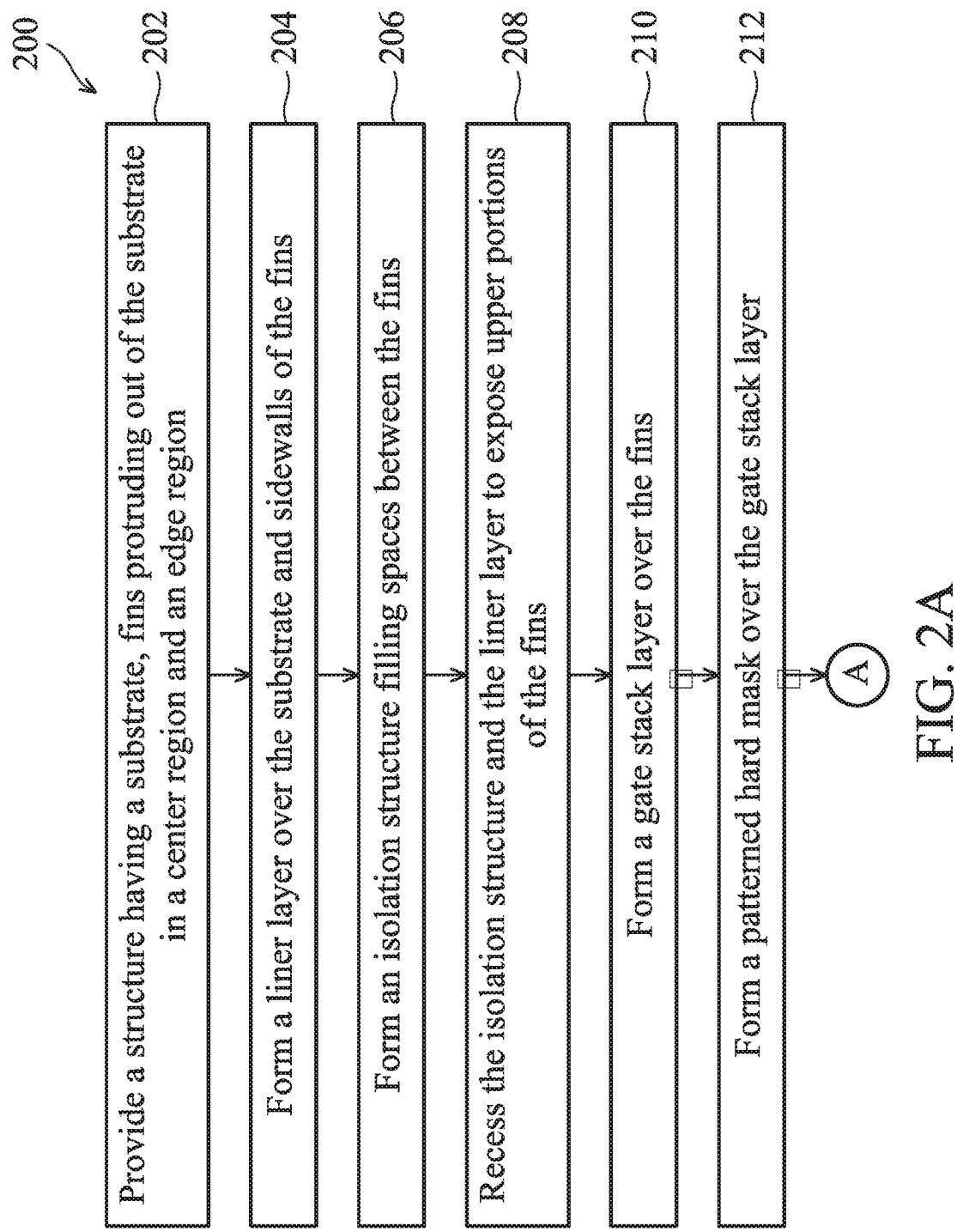
FIGS. 2A and 2B show a flow chart of a method for forming the semiconductor structure shown in FIGS. 1A-1D, according to aspects of the present disclosure.
Figure 2B:
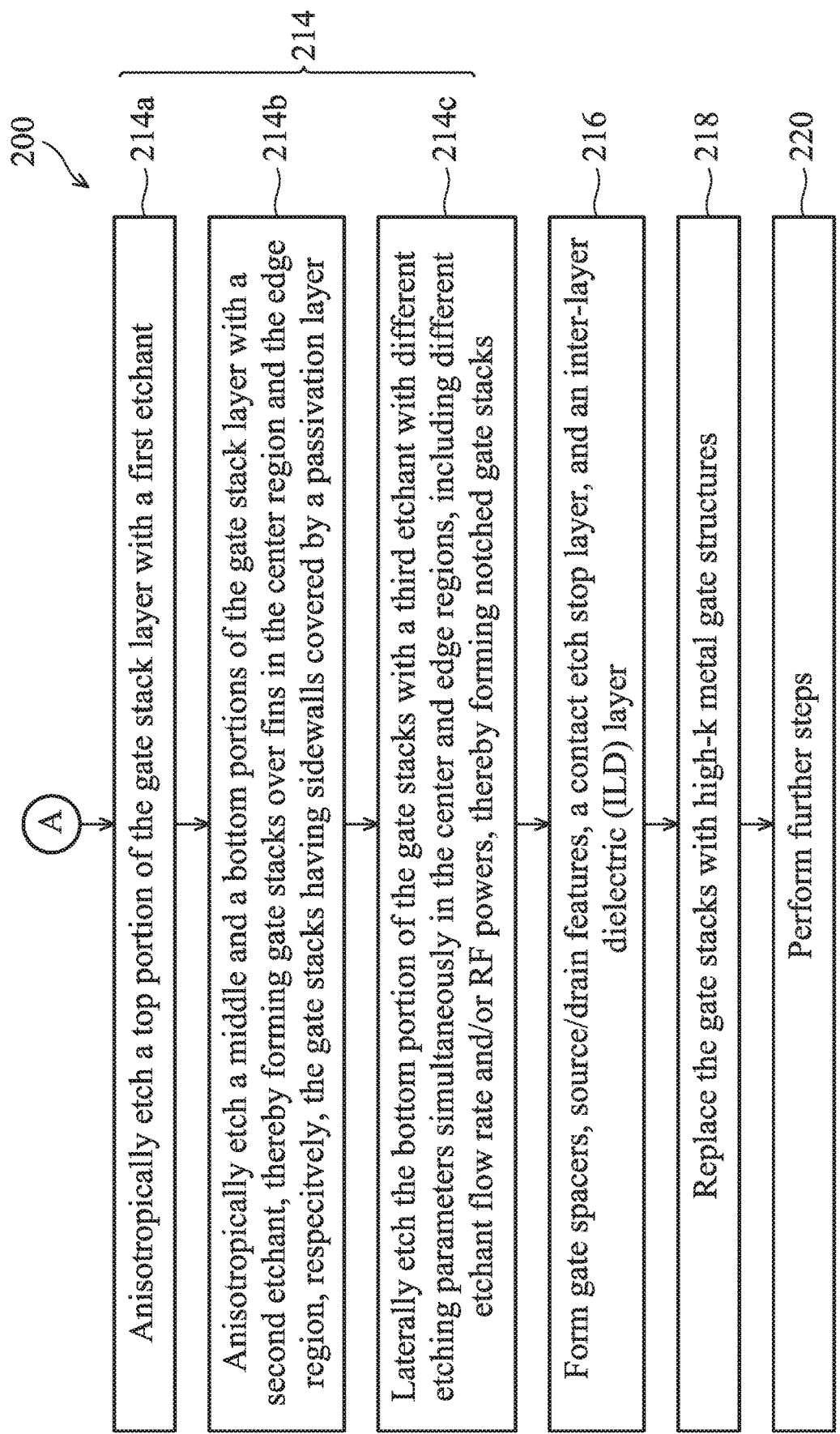
Figure 11A:
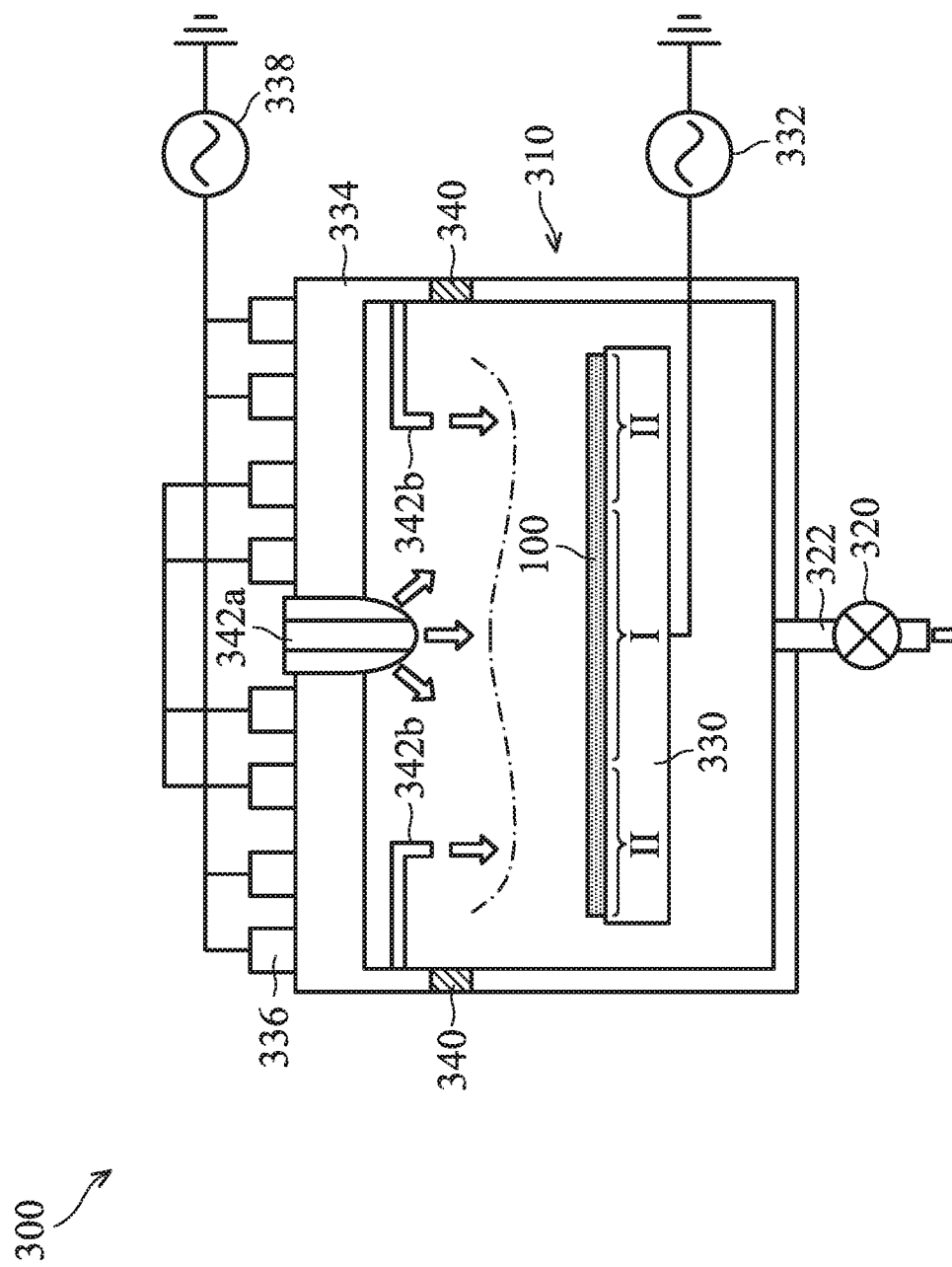
FIGS. 11A and 11B show exemplified plasma process chambers used in a fabrication process according to the method of FIGS. 2A and 2B, according to aspects of the present disclosure.
Figure 11B:
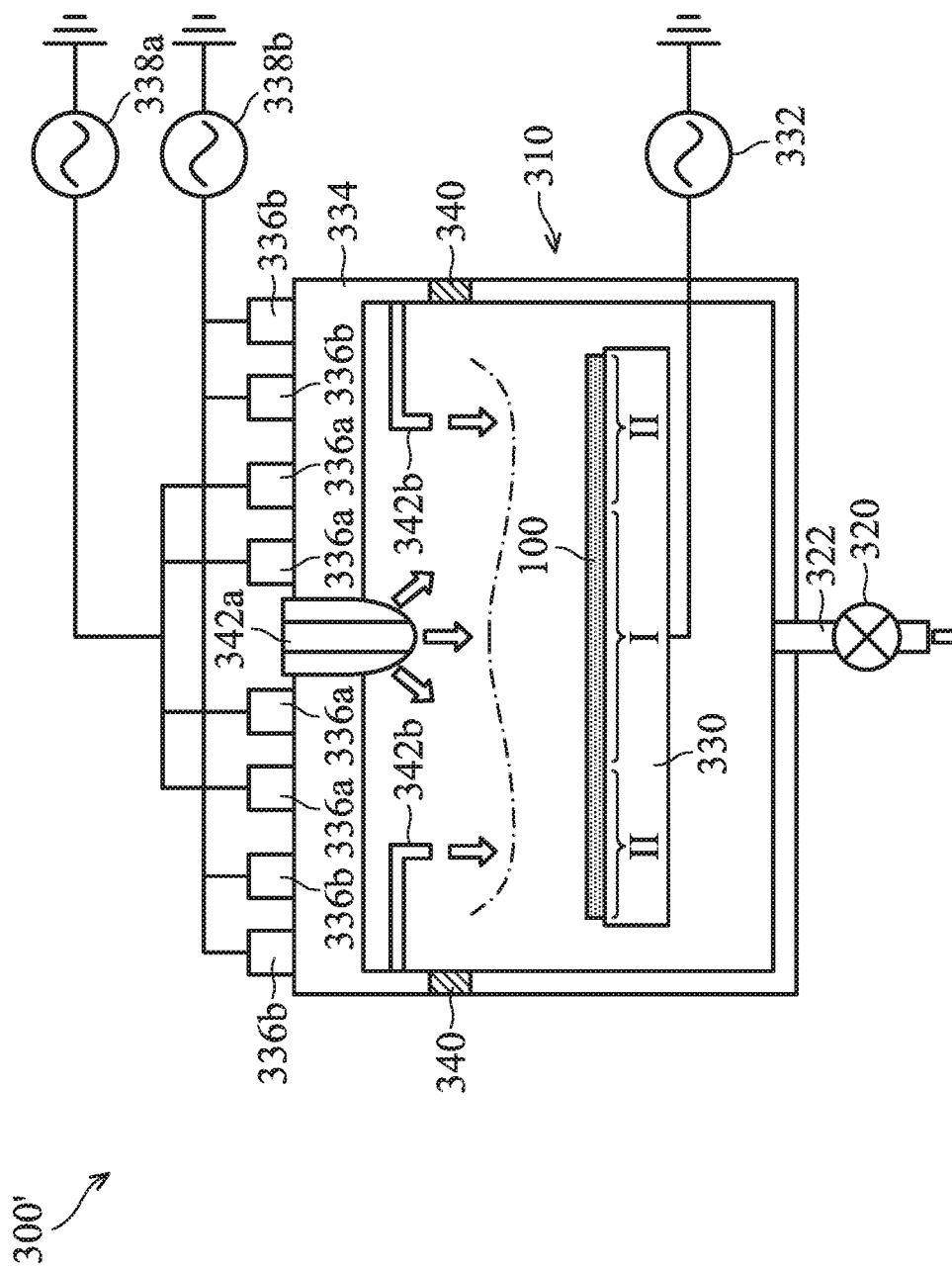

FIGS. 2A and 2B illustrate a flow chart of a method 200 for forming the device 100 in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-16B. FIGS. 3-10B and 12A-16B illustrate various cross-sectional views of the semiconductor device 100 during fabrication steps according to the method 200. Specifically, FIGS. 3-9 illustrate a cross-sectional view of the device 100 along the D-D line of FIG. 1A. FIGS. 10A, 12A, 13A, 14A, 15A, and 16A illustrate cross-sectional views of the device 100 along the B-B line of FIG. 1A. FIGS. 10B, 12B, 13B, 14B, 15B, and 16B illustrate cross-sectional views of the device 100 along the C-C line of FIG. 1A. FIGS. 11A and 11B illustrate various exemplary plasma processing chambers suitable for using in certain operations of the method 200.

At operation 202, the method 200 (FIG. 2A) provides, or is provided with, a device structure 100 having a substrate 102, such as shown in FIG. 3. The various materials for the substrate 102 have been discussed above with reference to FIGS. 1A-1D. In various embodiments, the substrate 102 is a wafer, such as a silicon wafer, and may include one or more epitaxially grown semiconductor layers in its upper portion. Operation 202 also includes forming a patterned mask 101 over the substrate 102. The patterned mask 101 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, become the patterned mask 101. The patterned mask 101 may include silicon oxide, silicon nitride, photoresist, or other suitable materials in various embodiments.

Figure 4:
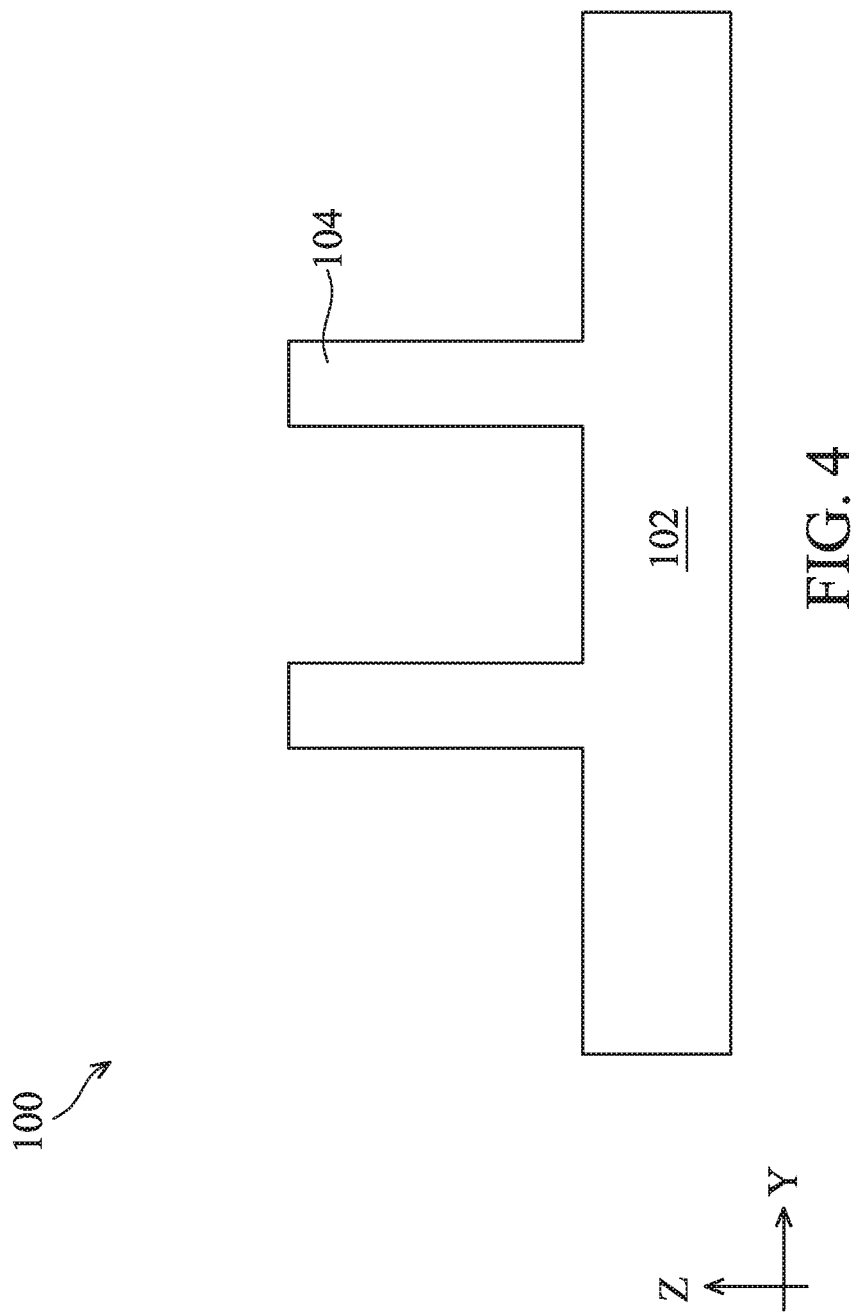

Operation 202 further includes etching the substrate 102 using the patterned mask 101 as an etch mask, thereby forming the fins 104, such as shown in FIG. 4. The patterned mask 101 is removed thereafter. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Figure 5:
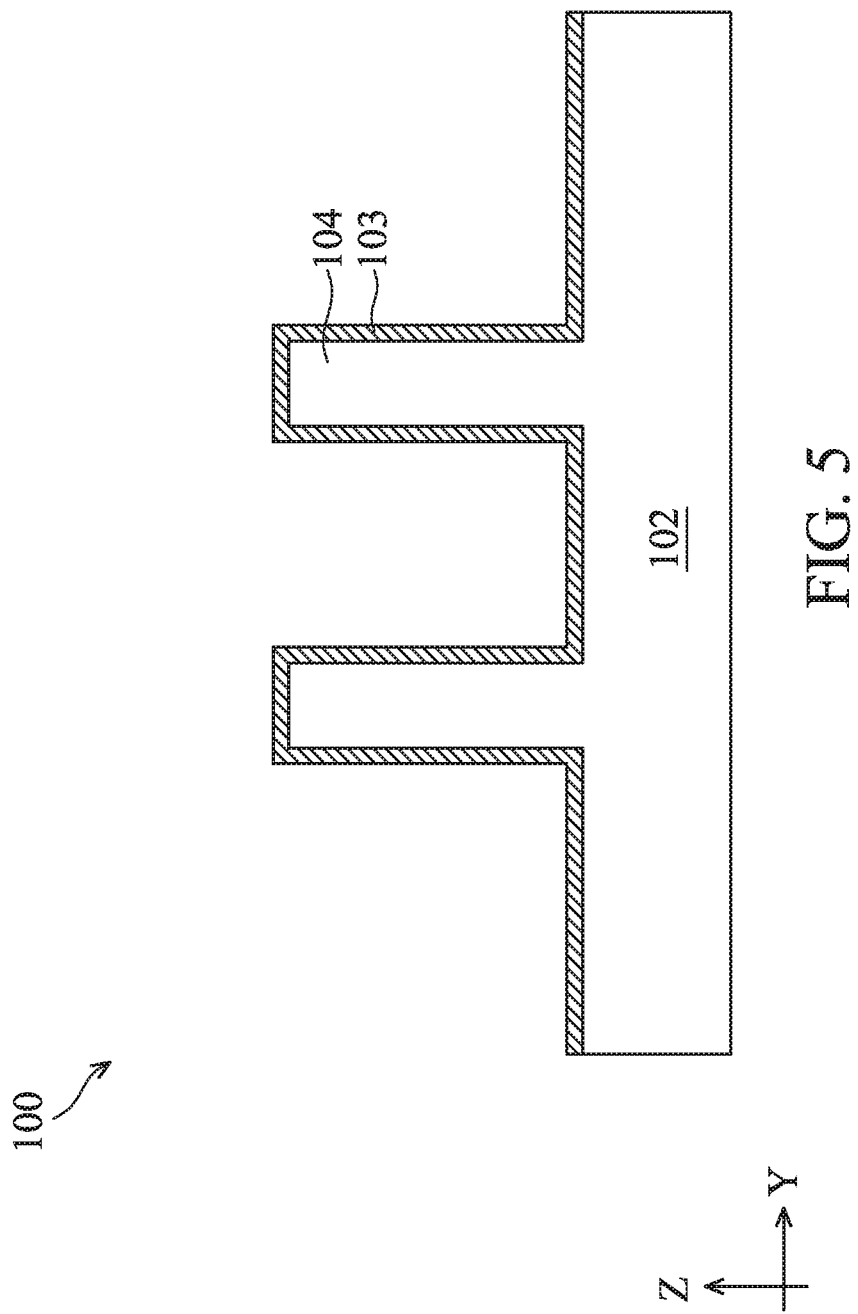

At operation 204, the method 200 (FIG. 2A) forms a liner layer 103 over sidewalls of the fins 104. In the illustrated embodiment, the liner layer 103 is deposited over top and sidewalls of the fins 104 and over a top surface of the substrate 102, such as shown in FIG. 5. To further the illustrated embodiment, the liner layer 103 includes silicon nitride (e.g., $Si_3N_4$), and may be deposited using LPCVD, PECVD, ALD, or other suitable methods. The liner layer 103 may be deposited to a thickness of 1 to 5 nm, such as 3 nm. Operation 204 may, operationally, further include applying an anisotropic etching process to the liner layer 103. The anisotropic etching process is designed to selectively etch the liner layer 103 but does not etch the substrate 102. The operation 204 may removes portions of the liner layer 103 from the top surface of the substrate 102, thereby exposing the substrate 102 between the fins 104 (not shown). The portion of the liner layer 103 on the sidewalls of the fins 104 remains substantially un-etched due to the highly directional etching. Further, the top surface of the fins 104 may or may not be exposed by this anisotropic etching process. In an embodiment where the liner layer 103 includes silicon nitride, the operation 204 may employ a remote $O_2/N_2$ discharge with a fluorine-containing gas such as $CF_4$, $NF_3$, or $SF_6$, and may additionally include hydrogen ($H_2$) or $CH_4$. Various other methods of selectively etching the liner layer 103 are possible.

Figure 6:
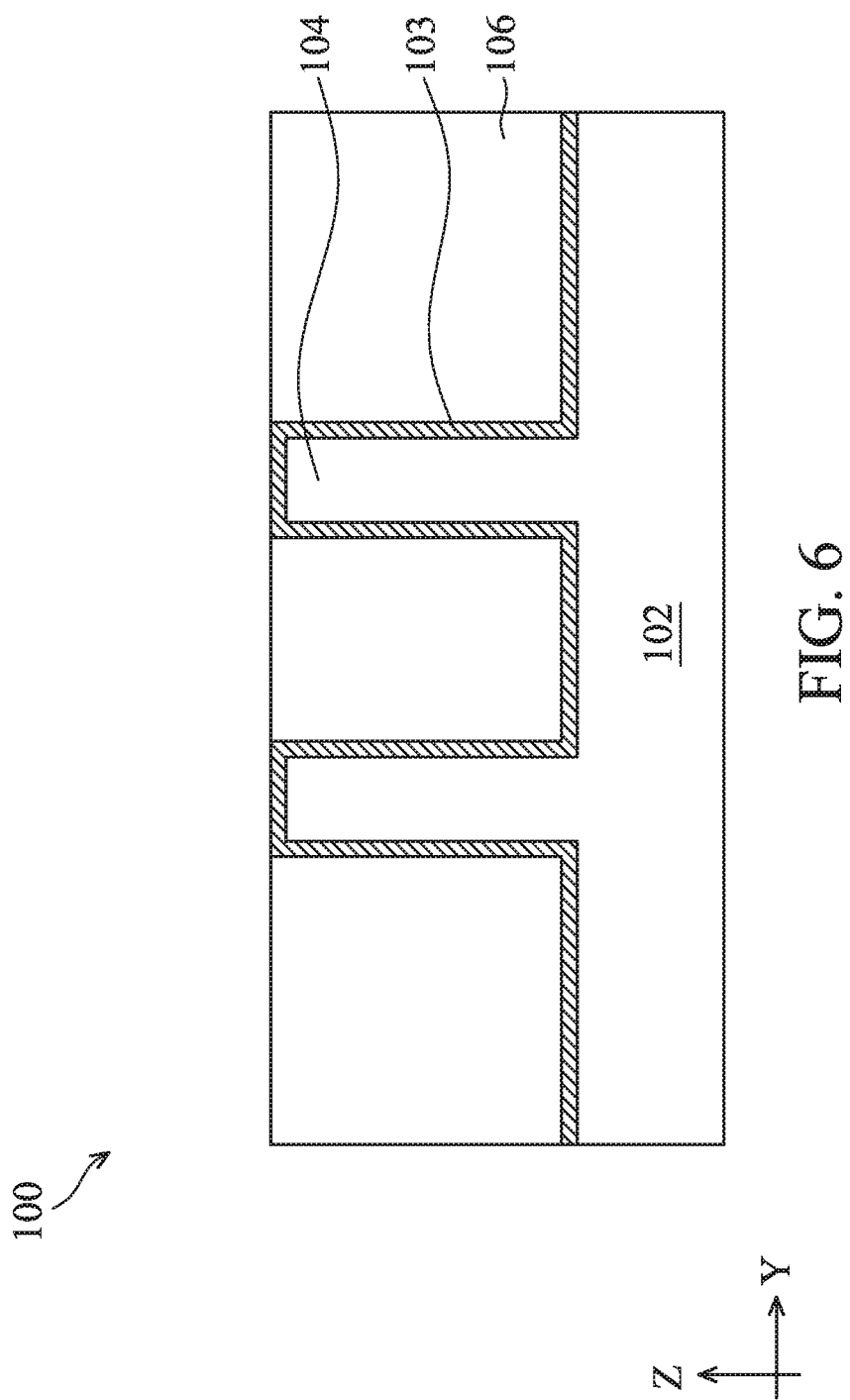

At operation 206, the method 200 (FIG. 2A) forms an isolation structure 106 over the liner layer 103 and filling spaces between the fins 104, such as shown in FIG. 6. The operation 206 may include a variety of processes such as deposition (e.g., FCVD), annealing, chemical mechanical planarization (CMP), and etching back. For example, the operation 206 may deposit a flowable dielectric material over the substrate 102 and filling spaces between the fins 104. In some embodiments, the deposition of the flowable dielectric material includes introducing a silicon-containing compound and an oxygen-containing compound that react to form a flowable dielectric material, thereby filling the gaps. The material for the isolation structure 106 may include undoped silicate glass (USG), fluoride-doped silicate glass (FSG), phosphosilicate glass (PSG), borophosphosilicate glass (BPSG), or other suitable insulating material. Subsequently, the operation 214 treats the flowable material with some annealing processes to convert the flowable dielectric material into a solid dielectric material. The annealing processes may include dry annealing or wet annealing with a temperature ranging from 400 to 550° C. Thereafter, the operation 206 performs one or more CMP processes and/or etching back processes to recess the isolation structure 106.

Figure 7:
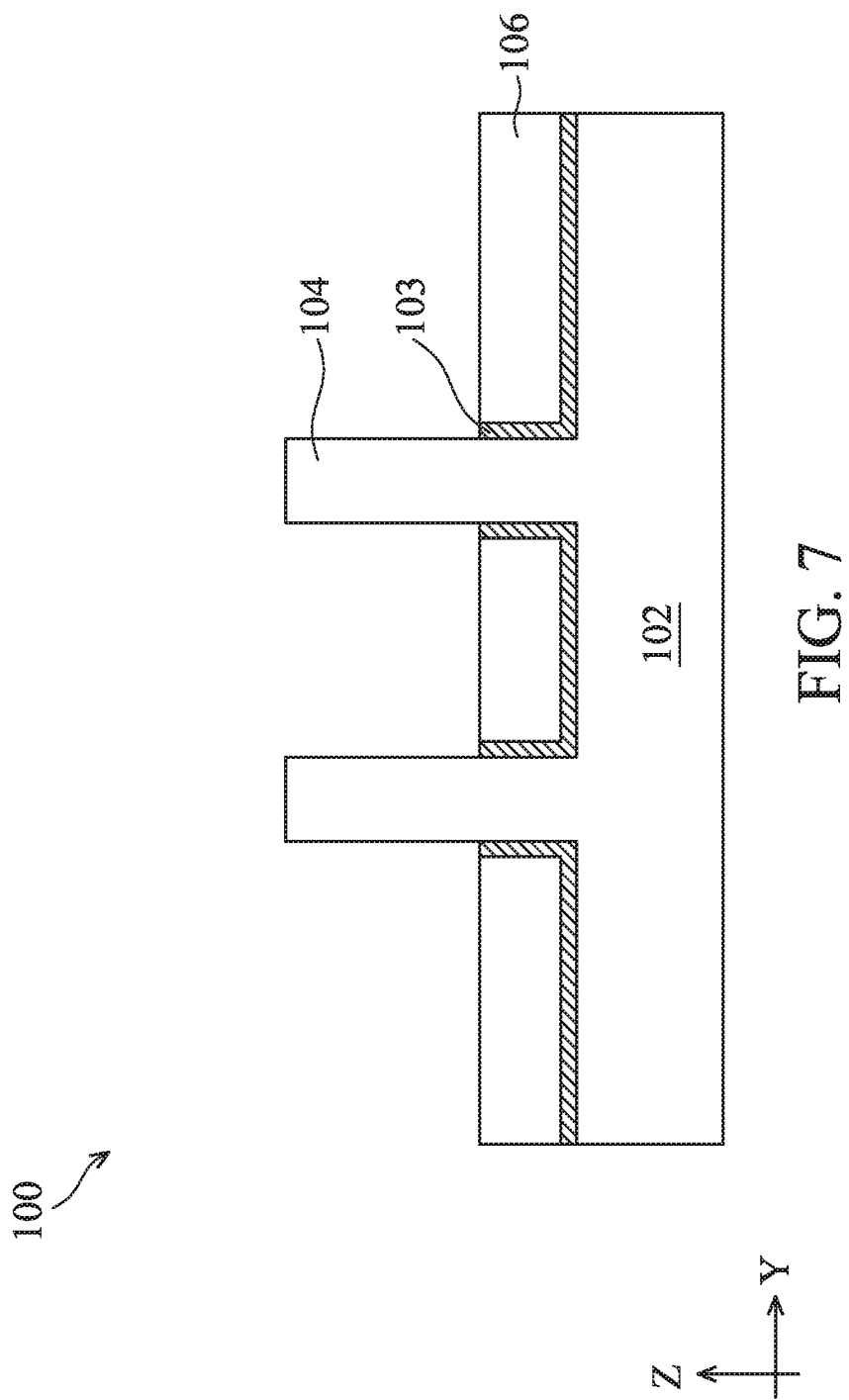

At operation 208, the method 200 (FIG. 2A) recesses the isolation structure 106 and the liner layer 103 to expose upper portions of the fins 104, such as shown in FIG. 7. The operation 208 may employ one or more wet etching, dry etching, reactive ion etching, or other suitable etching methods in various embodiments. For example, the isolation structure 106 and the liner layer 103 may be recessed in a single etch process. In alternative embodiments, the isolation structure 106 is recessed using a first etch process, and subsequently, the liner layer 103 is recessed using a second etch process.

Figure 8:
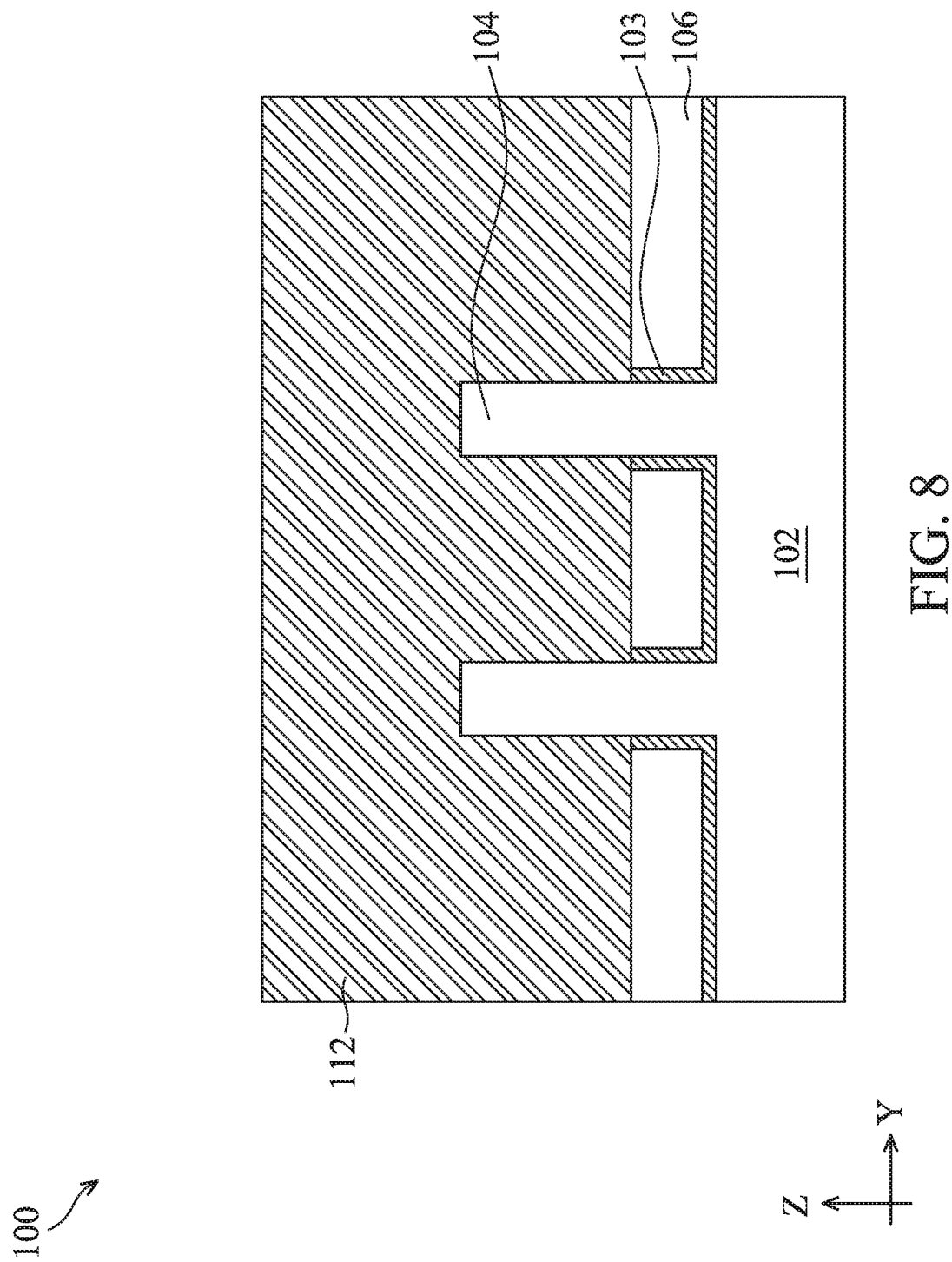

At operation 210, the method 200 (FIG. 2A) forms a gate stack layer 112 over the fins 104 and filling spaces between the fins 104, such as shown in FIG. 8. The gate stack layer 112 will be subsequently patterned to form a gate stack, which will be used to define and form the source/drain regions. In the illustrated embodiment, the gate stack to be patterned from the gate stack layer 112 is a dummy gate stack and will be replaced by a final gate stack in a gate-last process. In some embodiments, the gate stack to be patterned from the gate stack layer 112 is the final gate stack, for example, in a gate-first process.

In some embodiments, the gate stack layer 112 includes a dummy gate dielectric layer and a dummy gate electrode layer. The dummy gate dielectric layer is formed over the exposed fins 104. The dummy gate dielectric layer may be formed by thermal oxidation, CVD, sputtering, or any other methods known and used in the art for forming a dummy gate dielectric layer. In one embodiment, the dummy gate dielectric layer is formed of the same material as the isolation structure 106. In other embodiments, the dummy gate dielectric layer may be made of one or more suitable dielectric materials such as silicon oxide (e.g., $SiO_2$), silicon nitride (e.g., $Si_3N_4$), silicon oxynitride (e.g., SiON), low-k dielectrics such as carbon doped oxides, extremely low-k dielectrics such as porous carbon doped silicon dioxide, a polymer such as polyimide, the like, or a combination thereof. In other embodiments, the dummy gate dielectric layer includes dielectric materials having a high dielectric constant (k value), for example, greater than 3.9. The materials may include metal oxides such as $HfO_2$, $HfZrO_x$, $HfSiO_x$, $HfTiO_x$, $HfAlO_x$, TiN, the like, or a combination thereof. Subsequently, the dummy gate electrode layer is formed over the dummy gate dielectric layer. In some embodiments, the dummy gate electrode layer is a conductive material and may be selected from a group comprising poly-crystalline silicon (poly-Si), poly-crystalline silicon-germanium (poly-SiGe), silicon nitride (e.g., $Si_3N_4$), metallic nitrides, metallic silicides, and metallic oxides. In an embodiment, the dummy gate electrode layer may be deposited by PVD, CVD, sputter deposition, or other techniques known and used in the art for depositing conductive materials. The top surface of the dummy gate electrode layer usually has a non-planar top surface and may be planarized in one or more CMP processes after it is deposited.

Figure 9:
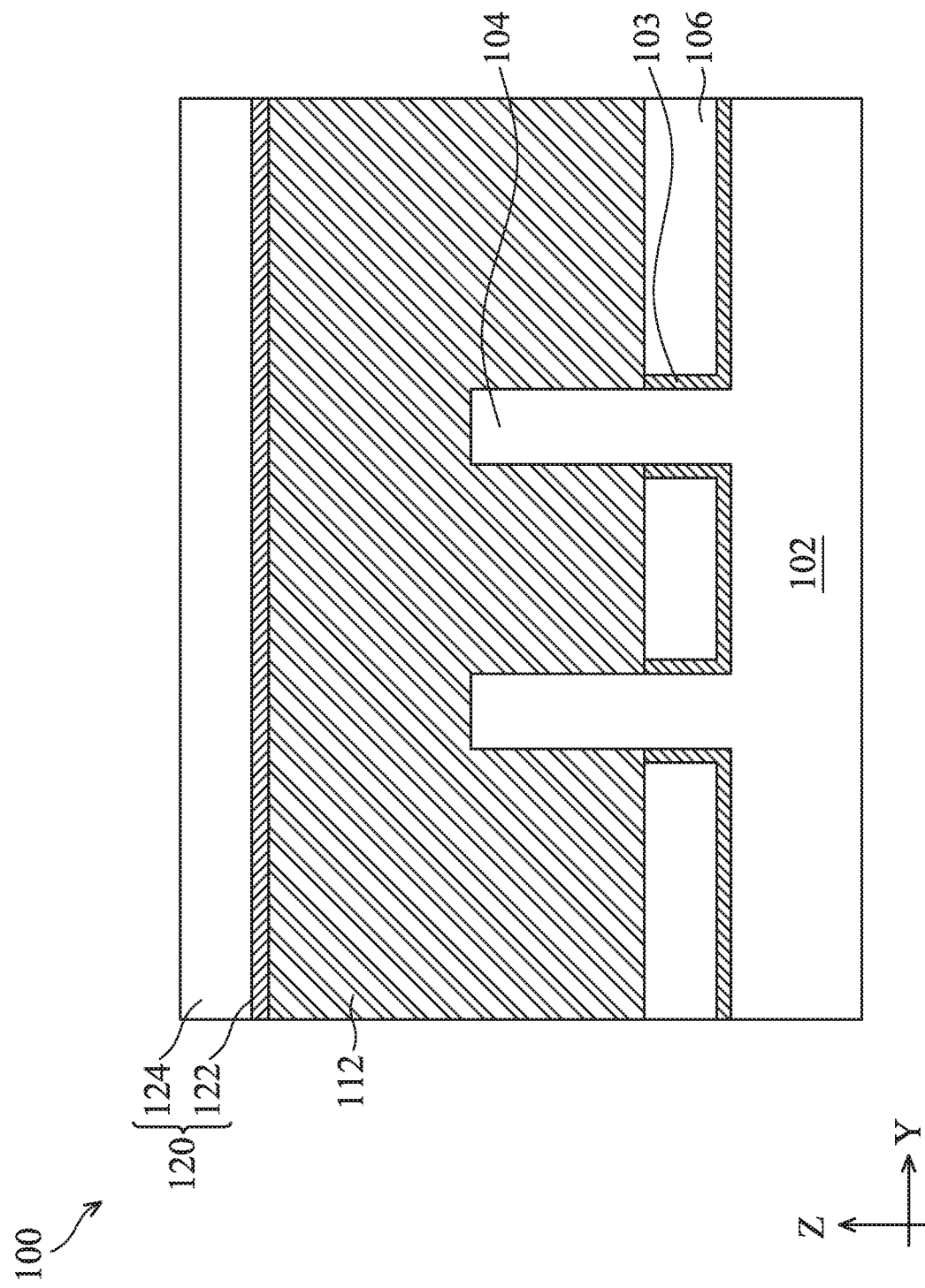

At operation 212, the method 200 (FIG. 2A) forms a hard mask layer 120 over the gate stack layer 112. The hard mask layer 120 may include one or more patterning layers, such as a first hard mask layer 122 and a second hard mask layer 124, such as shown in FIG. 9. Each of the hard mask layers 122 and 124 may include one or more layers of dielectric material such as silicon oxide, silicon nitride, and/or silicon oxynitride. For example, the first hard mask layer 122 may be an oxide layer (e.g., silicon oxide) and the second hard mask layer 124 may be a nitride layer (e.g., silicon nitride). The first hard mask layer 122 and the second hard mask layer 124 may be deposited through a process such as CVD or other suitable methods. The first hard mask layer 122 may have a thickness from about 10 Å to about 50 Å and the second hard mask layer 124 may have a thickness from about 150 Å to about 850 Å.

Operation 212 further includes patterning the hard mask layer 120 by photolithography and etching processes, such as shown in FIGS. 10A and 10B, which show cross-sectional views of the device 100 cut along the B-B line and the C-C line of FIG. 1A, respectively. The photolithography and etching processes may first pattern the second hard mask layer 124, then pattern the first hard mask layer 122 using the patterned second hard mask layer 124 as an etching mask. An exemplary photolithography process may include forming a photoresist (not shown) over the second hard mask layer 124. A lithographic exposure is performed on the device 100 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, the exposed portions of the second hard mask layer 124 may be removed by an etching process, such as wet etching, dry etching, Reactive Ion Etching (RIE), ashing, and/or other etching methods. Subsequently, a pattern formed in the etched second hard mask layer 124 is transferred to the first hard mask layer 122 by selectively etching through openings in the patterned second hard mask layer 124, resulting in a patterned hard mask layer 122. The patterned hard mask layers 122 and 124 are denoted collectively as a patterned hard mask 120. After etching, the photoresist may be removed.

At operation 214, the method 200 (FIG. 2B) patterns the gate stack layer 112 using the patterned hard mask 120 as an etching mask. In an embodiment, the operation 214 includes first patterning the various layers of the gate stack layer 112 including the dummy gate electrode layer and the dummy gate dielectric layer to form gate stacks with substantially vertical sidewalls, and subsequently laterally etching the bottom portion of gate stacks to form notched bases. In a particular embodiment, the operation 214 uses a dry etch process, such as plasma etching, reactive-ion etching (RIE), or other suitable anisotropic etching methods. Relatively speaking, the merits of implementing a dry etch process are due mainly to its simplicity of controlling the plasmas and its result of producing more repeatable results than other processes, such as a wet etch method. Many plasma parameters, such as gas pressure, chemistry, and the source/biased power can be varied or modified during the dry etch process to fine tune resulted gate stack sidewall profile.

An exemplary plasma processing chamber (or plasma etch reactor) 300 suitable for operation 214, according to various embodiments of the present disclosure, is illustrated in FIG. 11A. The plasma etch reactor chamber 300 includes a vacuum chamber 310. The vacuum chamber 310 is in fluid communication with a vacuum source 320 via a passage 322. The vacuum source 320 can include one or more vacuum pumps. The vacuum source 320 is operable in maintaining the interior of the vacuum chamber 310 at a suitable low pressure (e.g., below 100 mTorr). The plasma etch reactor 300 also includes a chuck 330 for holding the device 100. As discussed above, the device 100 can be divided into multiple regions, such as a center region I and an edge region II surrounding the center region I. In some embodiments, the chuck 330 is a cantilevered electrostatic chuck, and the device 100 is positioned on the chuck 330 by an electrostatic clamp, a mechanical clamp, or other clamping mechanism. The chuck 330 is conductive and electrically coupled to a bias voltage source 332. The plasma etch reactor 300 further includes a dielectric top cover 334 with a plurality of electrodes 336 mounted thereon. The dielectric top cover 334 and the electrodes 336 may further be insulated by the insulation members 340 from the side and bottom portions of the vacuum chamber 310. The electrodes 336, such as antennas or planar coils, are powered by a suitable radio frequency (RF) power source 338 to transmit RF energy into the vacuum chamber 310. Coupled with the bias from the bias voltage source 332, the RF energy is capable of transforming etchant gas inside the vacuum chamber 310 into plasma.

Instead of using a gas ring or a gas showerhead to supply etchant gas into the chamber, the plasma etch reactor 300 further includes a plurality of gas injectors 342 spreading through the space above the chuck 330, such as a central gas injector 342a and peripheral gas injectors 342b. The gas injectors 342 provide etchant gas to generate plasma within the vacuum chamber 310. In some embodiments, the etchant gas is an inert gas, such as argon. In some other embodiments, the etchant gas can be an inert gas, oxygen, nitrogen, $CF_4$, $Cl_2$, HBr, and/or a combination thereof. Each gas injector 342 may include one or more nozzles capable of injecting gas downwardly or in a tilted angel. Furthermore, each gas injector 342 is individually operable to modulate etchant flow rate or completely shut off the fluid communication with the vacuum chamber 310, such as by tuning a valve associated with the respective gas injector. By applying different etchant flow rate settings to gas injectors 342, the etchant flow rate (or etchant concentration) directly above different regions of the device 100 can vary. For example, by setting a higher etchant flow rate to the peripheral gas injectors 342b than the central gas injector 342a, the etchant concentration above the edge region II may become about 5% to about 20% higher than the center region I. In a specific example, the edge region II and the center region I have an etchant concentration ratio about 53%:47%. The higher etchant concentration in an edge region compensates the etchant's relatively weaker etching capability away from a center region, resulting in effective the same etch rates in both edge and center regions. Therefore, introducing etchant concentration regional variation instead of keeping a constant etchant concentration is found effective in mitigating center-to-edge etch bias and CD bias at a wafer scale. In various other embodiments, the plasma etch reactor 300 is capable of setting etchant concentration variation over more than two regions, such as a gradient over three regions including an edge region, a middle region, and a center region of the device 100.

The plasma etch reactor 300' as shown in FIG. 11B is similar to the one shown in FIG. 11A. Therefore, reference numerals in FIG. 11A are repeated in FIG. 11B to show the same or similar features. Furthermore, some descriptions of the same or similar features are abbreviated or omitted by referring to the descriptions of the plasma etch reactor 300 in FIG. 11A for the sake of simplicity. The plasma etch reactor 300' has multiple groups of electrodes 336, such as a central group of electrodes 336*a*, which is electrically coupled to a first RF power source 338*a*, and an edge group of electrodes 336*b*, which is electrically coupled to a second RF power source 338*b*. The RF power sources 338*a* and 338*b* couple different strength of RF energy into the central and edge groups of electrodes, respectively. Therefore, the RF field strength varies above different regions of the device 100. For example, the second RF power source 338*b* may generate substantially more RF power than the first RF power source 338*a*, resulting in a stronger RF field above the edge regional II than above the center region I, which enhances etchant's etching capability at edge regions. In other embodiments, gas injectors 342 can also be adjusted together with the RF power sources 338 to enhance etchant's etching capability in targeted regions.

Figures 12A, 12B:
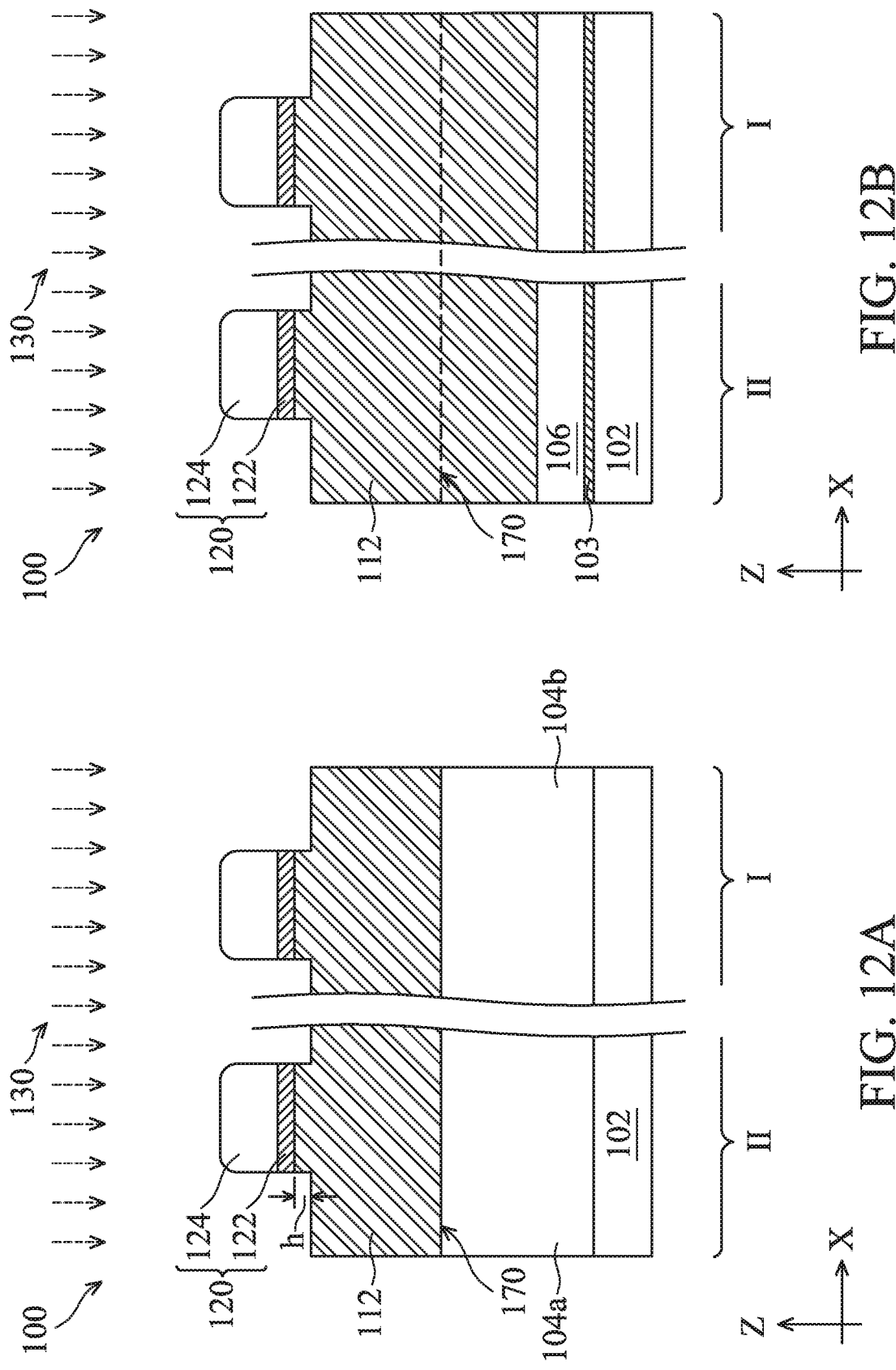

Referring back to FIG. 2B, the method 200 at operation 214 may include operations 214*a*, 214*b*, and 214*c*, which are further discussed below. At operation 214*a*, the method 200 anisotropically etch a top portion of the gate stack layer 112 using the patterned hard mask 120 as an etching mask, such as shown in FIGS. 12A and 12B. The etching process may recess the top surface of the gate stack layer 112 at a distance h ranging from about 1 nm to about 20 nm. The etching process may be a dry etching process performed inside a plasma etch reactor similar to the ones illustrated above in FIGS. 11A and 11B. The dry etching process includes the usage of one or more etchants or a mixture of etchants. For example, the etchant 130 may have the atoms of chlorine, fluorine, argon, bromine, hydrogen, carbon, or a combination thereof. For example, the etchant 130 may be a plasma containing a mixture of $CF_4$ and $Cl_2$ (i.e., $CF_4/Cl_2$ plasma). In furtherance of the example, the etching process is applied with an $CF_4/Cl_2$ flow rate between 0 and about 500 sccm, a gas pressure between 0 and about 60 mtorr, an RF power between 0 and about 1000 W, and a bias voltage between 0 and about 200 V. In one embodiment, at operation 214*a*, the gas injectors 342 are set to maintain a substantial constant etchant flow rate across different regions of the device 100. In yet another embodiment, the operation 214*a* is optional and can be skipped.

Figure 13A:
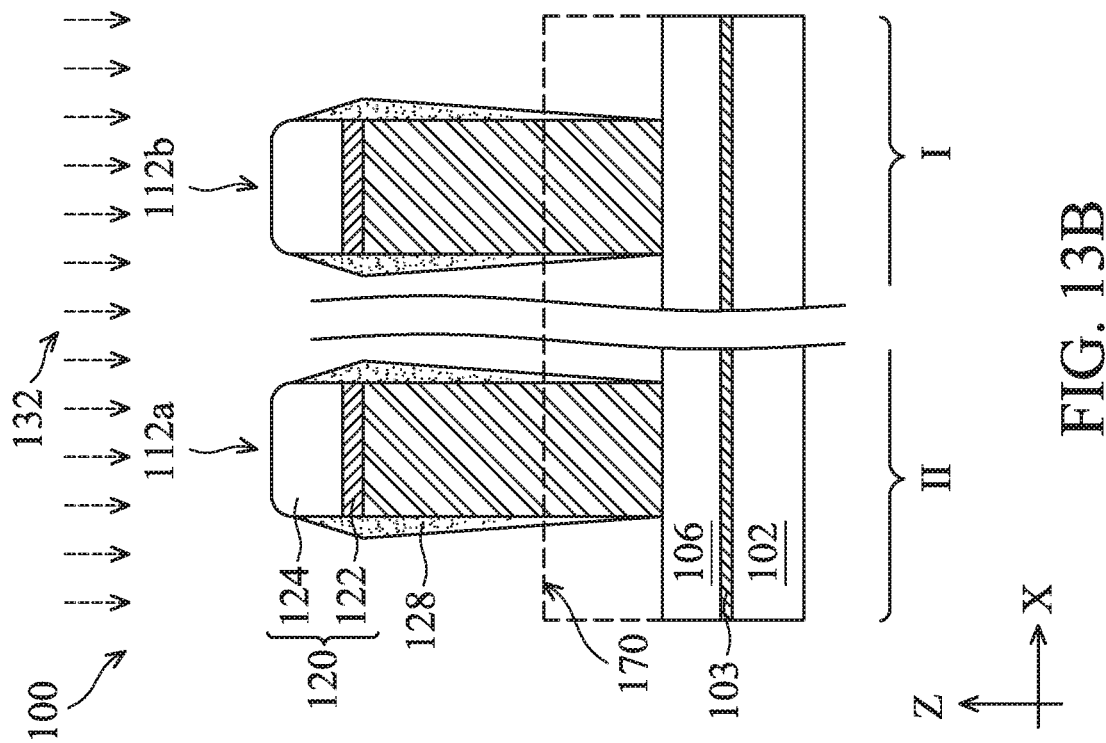
Figure 13B:
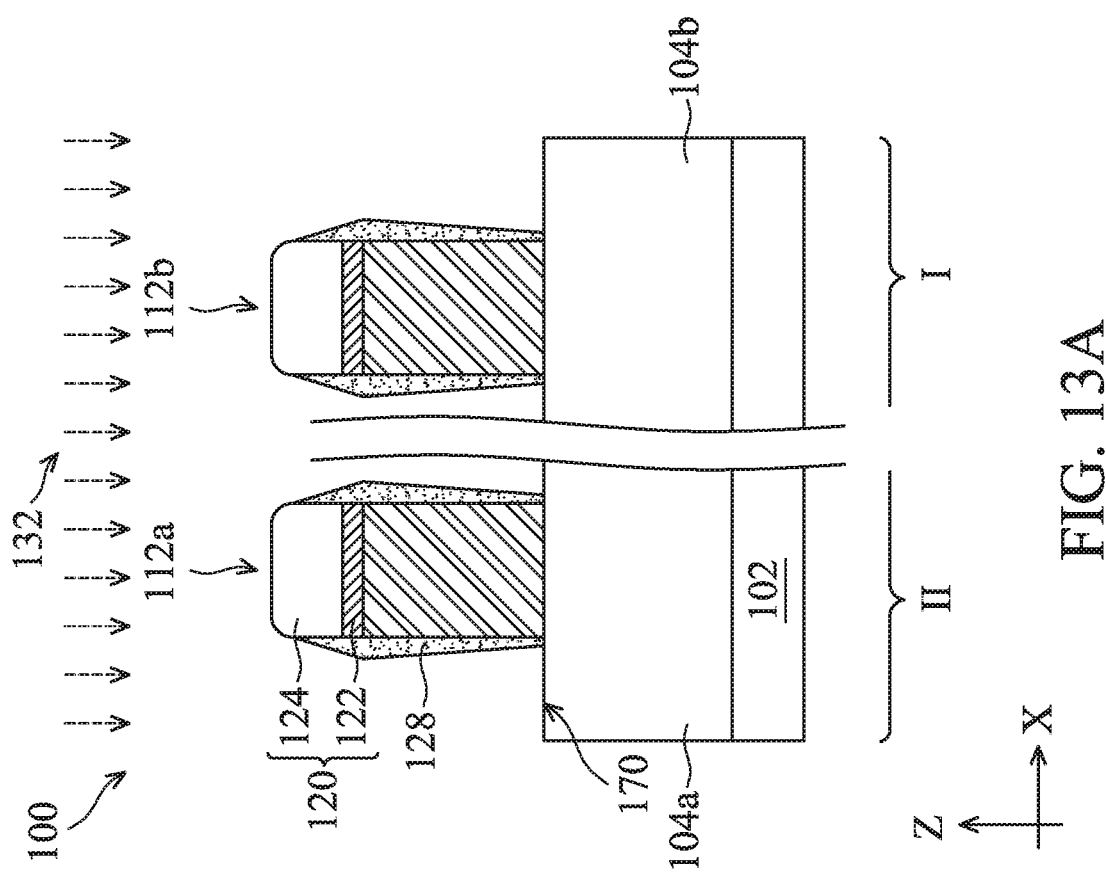

At operation 214*b*, the method 200 (FIG. 2B) continues to anisotrpically etch the middle and bottom portions of the gate stack layer 112 to form gate stacks, such as shown in FIGS. 13A and 13B. The etching process uses a top portion of the patterned gate stack layer 112 formed in the previous operation 214*a* and the patterned hard mask 120 collectively as an etching mask, resulting in a plurality of gate stacks, such as gate stacks 112*a* and 112*b*. The etching process is a selectively etching that does not substantially damage the top surface 170 of the fins 104 and the top surface of the isolation structure 106. The operation 214*b* may include a dry etching process with an etchant 132 having the atoms of chlorine, fluorine, bromine, oxygen, hydrogen, carbon, or a combination thereof. For example, the etchant 132 may have a gas mixture of $Cl_2$, $O_2$, a carbon-and-fluorine containing gas, a bromine-and-fluorine containing gas, and a carbon-hydrogen-and-fluorine containing gas. Specifically, the etchant 132 includes at least one gas that can passivate exposed sidewalls of the gate stacks 112*a* and 112*b*, such as $O_2$ or a mixture of $O_2$ and $N_2$. In one embodiment, the silicon containing particles bombarded away during the etch process may react with the passivation gas to generate silicon oxide or silicon nitride containing particles that partially deposit on sidewalls of the gate stacks 112*a* and 112*b* and form a passivation layer 128. The passivation layer 128 protects sidewalls of the gate stack from further etching by the etchant 132. The passivation layer 128 may have a lower portion thinner than an upper portion, as its upper portion is exposed to oxide and/or nitride particles in a longer time than its lower portion. In one example, the etchant 132 includes $O_2$ and the passivation layer 128 includes silicon oxide. In another example, the etchant 132 includes $NH_3$ and the passivation layer 128 includes silicon nitride. In yet another example, the etchant 132 includes $O_2$ and $N_2$, and the passivation layer 128 includes silicon oxynitride. In a specific embodiment, the etchant 132 is a plasma containing a mixture of $Cl_2$, $O_2$, $CF_4$, $BCl_3$, and $CHF_3$. In another embodiment, the etchant 132 is a plasma containing a mixture of HBr and $O_2$ (i.e., $HBr/O_2$ plasma). The etching process may be performed inside a plasma etch reactor similar to the ones illustrated above in FIGS. 11A and 11B, with other parameters such as a HBr flow rate less than about 500 sccm, a gas pressure less than about 60 mtorr, an RF power less than about 1000 W, and a bias voltage less than about 200 V. The operation 214*b* may be in-situ with the operation 214*a* in the same plasma etch reactor. In one embodiment, at operation 214*b*, the gas injectors 342 are set to maintain a substantially constant etchant flow rate across different regions of the device 100.

Figure 14A:
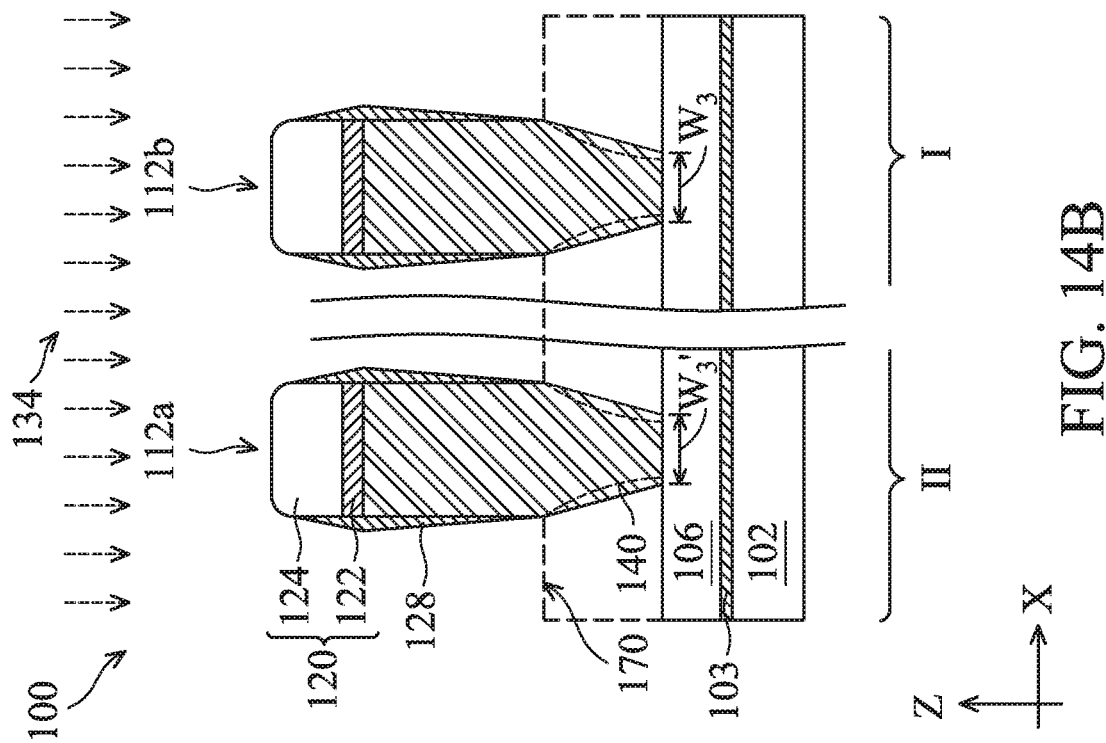
Figure 14B:
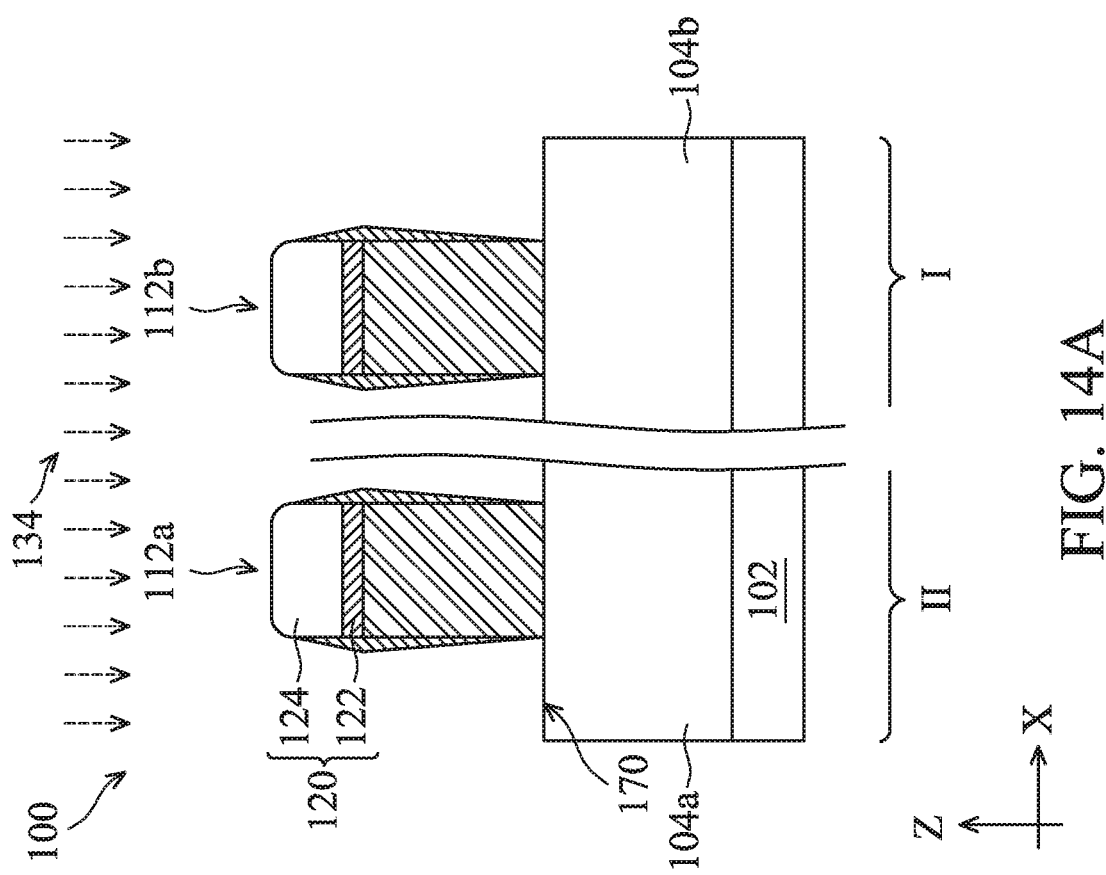

At operation 214*c*, the method 200 (FIG. 2B) etches the bottom portion of the gate stack 112*a* and 112*b*, resulting in a notched gate profile, such as shown in FIGS. 14A and 14B. The operation 214*c* may include a dry etching process performed inside a plasma etch reactor similar to the ones illustrated above in FIGS. 11A and 11B, but under a stronger bias voltage, higher RF power, and/or higher gas pressure than in the operation 214*b*, which modulates the etchant to exhibit stronger lateral etching capability. The etching process is also a selectively etching that does not substantially damage the top surface 170 of the fins 104 and the top surface of the isolation structure 106. The operation 214*c* may apply an etchant 134 having the atoms of chlorine, fluorine, bromine, hydrogen, carbon, or a combination thereof. In one embodiment, the etchant 134 is the same as the etchant 132 used in the operation 214*b* but without passivation gases. In furtherance of the embodiment, the etchant 134 is a plasma containing HBr (i.e., HBr plasma), but free of $O_2$, $N_2$, or $NH_3$. The operation 214*c* may be in-situ with the operations 214*a* and 214*b* in the same plasma etch reactor, with other parameters such as a HBr flow rate between about 500 and about 1000 sccm, a gas pressure between about 60 and about 90 mtorr, an RF power between about 1000 W and about 2000 W, and a bias voltage between about 200 V and about 500 V. The etchant 134 has certain lateral etch rate toward the passivation layer 128 covering sidewalls of the gate stacks 112*a* and 112*b*. The passivation layer 128 at its bottom portion is removed by the etchant 134 earlier than its top portion due to its relatively thinner thickness, therefore exposing the bottom sidewalls of the gate stacks 112*a* and 112*b* while the top sidewalls are still covered. The etchant 134 subsequently laterally etches the exposed bottom sidewalls and form a notched gate structure profile. The remaining passivation layer 128 protects the top portion of the sidewalls from etching. The notched sidewalls may exhibit a curvature surface profile in some embodiments, as illustrated by the dotted line 140. The dimensions of the notched gate stack profile have been discussed above with reference to FIGS. 1A-1D.

If the gas injectors 342, at operation 214c, are set to maintain a substantially constant etchant flow rate across different regions of the device 100, the bottom width $w_3$ of the gate stacks may have a large variation across the wafer. For example, a bottom width $w_3'$ in the edge region II may be about 2% to about 30% larger than a bottom width $w_3$ in the center region I. In the illustrated embodiment, by applying different etchant flow rate settings to gas injectors 342, the etchant flow rate (or etchant concentration) above different regions of the device 100 becomes different. For example, the etchant concentration above the edge region II of the substrate 102 may be maintained at a level about 5% to about 20% higher than the center region I. In a specific example, for a wafer with a center region I and an edge region II having substantially equal areas from a top view, a HBR plasma with a total flow rate 750 sccm is guided through the gas injectors 342, with about 53% flow rate (about 427.5 sccm) guided towards the edge region II and about 47% flow rate (about 322.5 sccm) guided towards the center region I. This etchant concentration regional variation is helpful in mitigating center-to-edge etch bias at a wafer scale and maintains substantially the same etch rate of bottom portion of the gate stacks in different regions across the wafer during notch formation. As a result, the bottom width $w_3$ and $w_3'$ are kept substantially the same. In some embodiments, the plasma etch reactor applies different RF power to generate different RF filed strength above the edge region II and the center region I to vary the respective etchant's etch rates, as discussed above in association with FIG. 11B. The RF power regional variation may be applied alone at the operation 214c or applied together with the etchant flow rate settings in gas injectors 342. Similarly, the RF power regional variation is helpful in mitigating center-to-edge etch bias at a wafer scale and maintains substantially the same etch rate of bottom portion of the gate stacks in different regions across the wafer during notch formation.

After operation 214, for two gate stacks 112a and 112b in different regions but supposed to have substantially the same bottom width, the respective bottom width $w_3'$ and $w_3$ have a maximum variation $\Delta w$ less than 10% across the wafer, in some embodiments. The maximum variation $\Delta w$ is denoted as $$\Delta w = \frac{w_3'max - w_3min}{(w_3'max + w_3min)/2}$$

where: $w_3'$max is the maximum $w_3'$ measured in edge region II;
$w_3$ min is the minimum $w_3$ measured in center region I; and
($w_3'$max+$w_3$ min)/2 represents an average gate stack bottom width.

In some embodiments, the bottom width $w_3$ and $w_3'$ have a maximum variation $\Delta w$ less than 5% across the wafer.

Figure 15B:
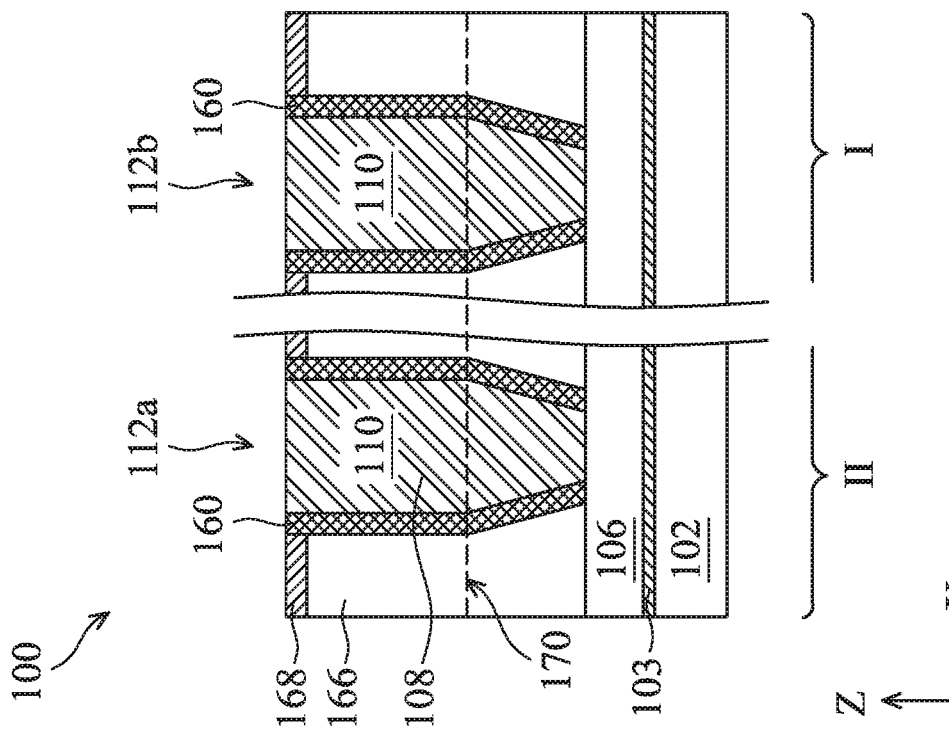
Figure 15A:
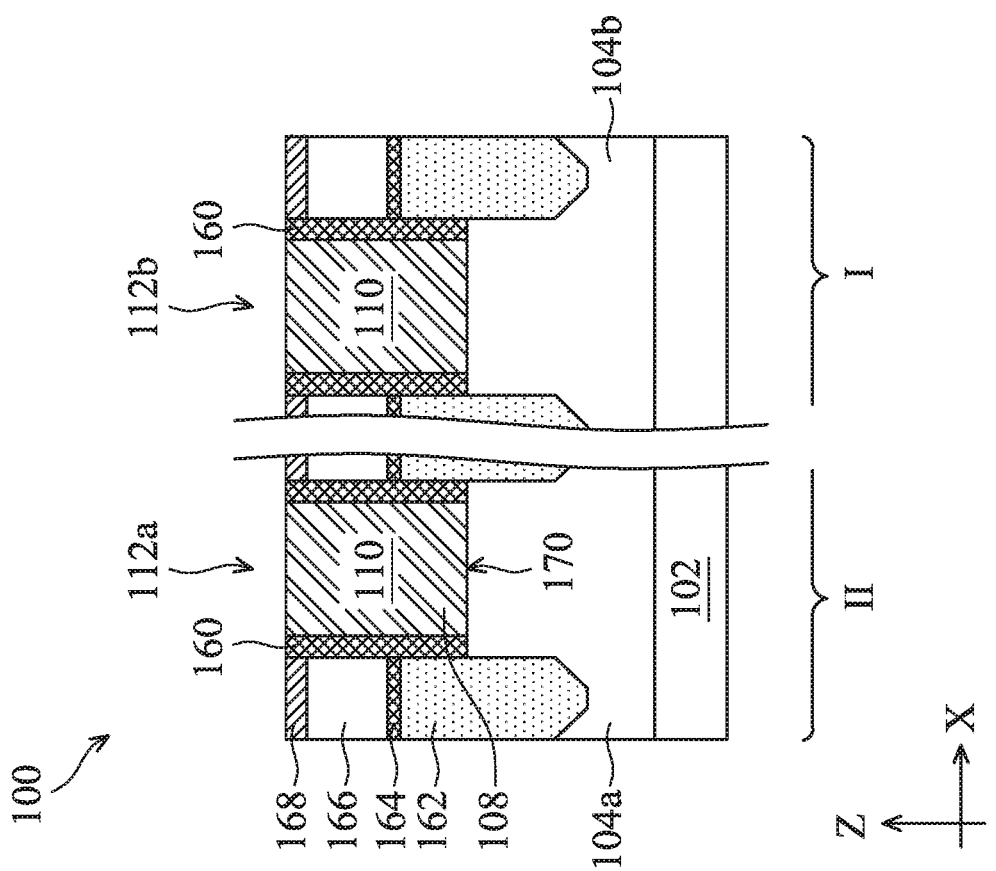

At operation 216, the method 200 (FIG. 2B) forms various features in or over the fins 104, including gate spacers 160, source/drain (S/D) features 162, a contact etch stop layer (CESL) 164, an interlayer dielectric (ILD) layer 166, and a protective dielectric layer 168, such as shown in FIGS. 15A and 15B. The operation 216 includes a variety of processes.

In a particular embodiment, the operation 216 forms the gate spacers 160 on sidewalls of the gate stacks 112. The gate spacers 160 may comprise a dielectric material, such as silicon oxide, silicon nitride, silicon oxynitride, silicon carbide, other dielectric material, or combinations thereof, and may comprise one or multiple layers of material. The gate spacers 160 may be formed by depositing a spacer material as a blanket over the isolation structure 106, the fins 104, and the dummy gate structures (not shown). Then the spacer material is etched by an anisotropic etching process. Portions of the spacer material on the sidewalls of the dummy gate structures remain and become the gate spacers 160.

Then, the operation 216 forms the S/D features 162 over the fins 104, the CESL 164 over the S/D features 162, the ILD layer 166 over the CESL 164, and the protective dielectric layer 168 over the ILD layer 166. For example, the operation 216 may etch recesses into the fins 104 adjacent to the gate spacer 160, and epitaxially grow semiconductor materials in the recesses. The semiconductor materials may be raised above the top surface of the fins 104. The operations 216 may form the S/D features 162 separately for NFET and PFET devices. For example, the operations 216 may form the S/D features 162 with n-type doped silicon for NFET devices or p-type doped silicon germanium for PFET devices. Thereafter, the operation 218 may deposit the CESL 164 and the ILD layer 166 over the S/D features 162. The CESL 164 may comprise silicon nitride, silicon oxynitride, silicon nitride with oxygen (O) or carbon (C) elements, and/or other materials; and may be formed by CVD, PVD, ALD, or other suitable methods. The ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD, FCVD, or other suitable methods. Subsequently, the operation 218 may etch back the ILD layer 166 and deposit the protective dielectric layer 168 which may comprise a nitride such as silicon nitride for protecting the ILD layer 166 during subsequent etching processes. The operation 216 performs one or more CMP processes to planarize the top surface of the device 100.

Figure 16B:
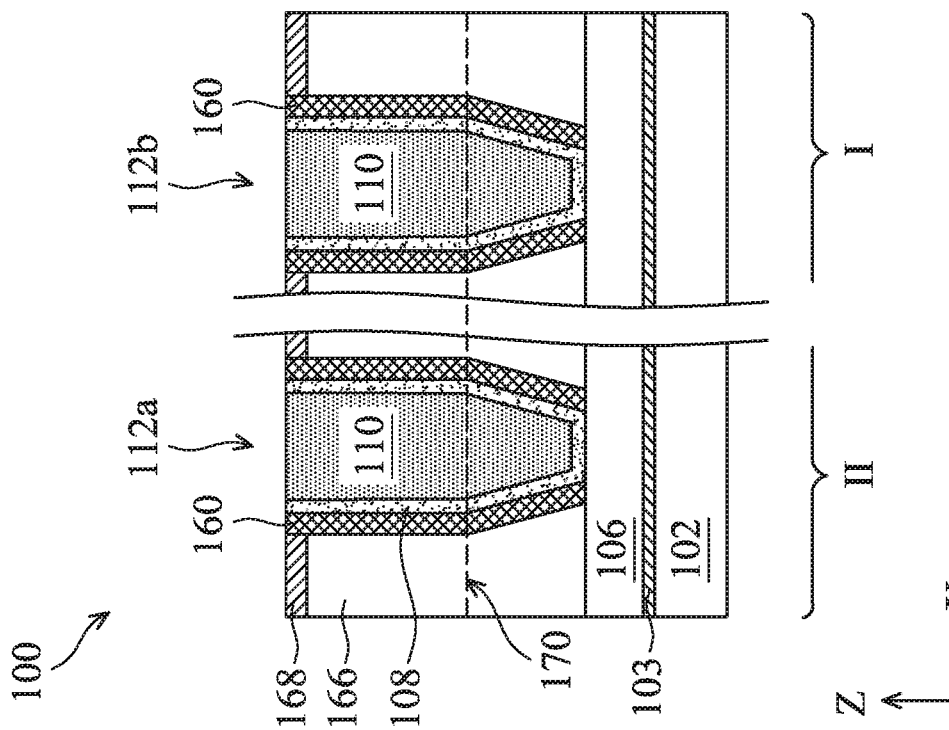
Figure 16A:
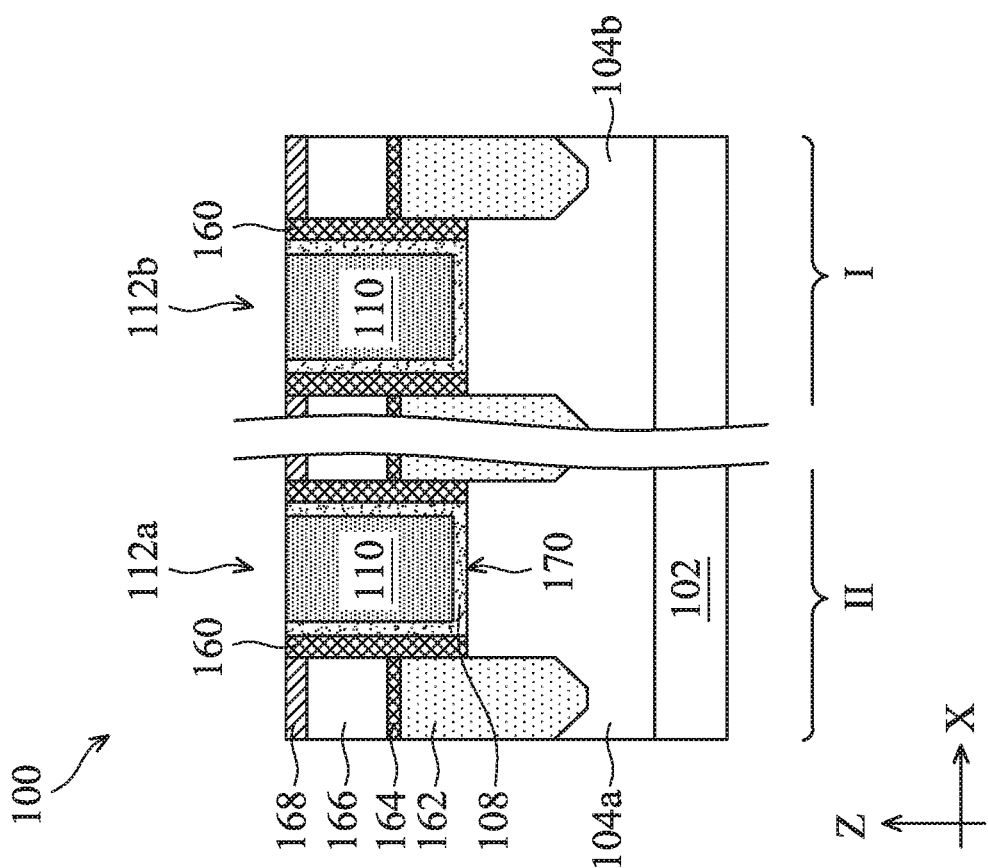

At operation 218, in a replacement gate process, the method 200 (FIG. 2B) replaces dummy gate stacks with high-k metal gate stacks 112 having a high-k dielectric layer 108 and a conductive layer 110, such as shown in FIGS. 16A and 16B. The operation 218 begins by removing the dummy gate structures to form gate trenches (not shown) between the gate spacers 160 and deposits high-k metal gate stacks 112 in the gate trenches. The high-k metal gate stacks 112 include the high-k dielectric layer 108 and the conductive layer 110. The high-k metal gate stacks 112 may further include an interfacial layer (e.g., silicon dioxide or silicon oxynitride) (not shown) between the high-k dielectric layer 108 and the fins 104. The interfacial layer may be formed using chemical oxidation, thermal oxidation, ALD, CVD, and/or other suitable methods. The materials of the high-k dielectric layer 108 and the conductive layer 110 have been discussed above with reference to FIGS. 1A-1D. The high-k dielectric layer 108 may include one or more layers of high-k dielectric material, and may be deposited using CVD, ALD, and/or other suitable methods. The conductive layer 110 may include one or more work function metal layers and a metal fill layer, and may be deposited using methods such as CVD, PVD, plating, and/or other suitable processes.

At operation 220, the method 200 (FIG. 2B) performs further steps to complete the fabrication of the device 100. For example, the method 200 may form contacts and vias electrically connecting the S/D features 162 and the gate stacks 112 and form metal interconnects connecting various transistors to form a complete IC.

Although not intended to be limiting, one or more embodiments of the present disclosure provide many benefits to a semiconductor device and the formation thereof. For example, embodiments of the present disclosure provide a notched gate structure and a gate fabrication technique that maintains the uniformity of notched gate structure profiles across a wafer. The notched gate structure reduces effective gate stack CDs and enlarges distance from a base of a gate stack to other FETs features, therefore mitigating possible shorting caused by metal gate protrusion and increasing a chip yield rate in the edge region of a wafer. Furthermore, formation of this notched gate structure can be easily integrated into existing semiconductor fabrication processes.

In one exemplary aspect, the present disclosure is directed to a method. The method includes providing a structure having a first region and a second region, the first region including a first channel region, the second region including a second channel region; forming a gate stack layer over the first and second regions; patterning the gate stack layer, thereby forming a first gate stack over the first channel region and a second gate stack over the second channel region; and laterally etching bottom portions of the first and second gate stacks by applying different etchant concentrations to the first and second regions simultaneously, thereby forming notches at the bottom portions of the first and second gate stacks. In some embodiments, the applying of the different etchant concentrations includes applying different etchant flow rate settings to gas injectors over the first region and the second region in a plasma processing chamber. In some embodiments the structure is a semiconductor wafer, the second region is a center region of the semiconductor wafer and the first region is a peripheral region of the semiconductor wafer, and the peripheral region receives a higher etchant concentration than the center region during the laterally etching of the bottom portions of the first and second gate stacks. In some embodiments, the peripheral region receives about 5% to about 20% higher etchant concentration than the center region during the laterally etching of the bottom portions of the first and second gate stacks. In some embodiments, the patterning of the gate stack layer includes performing an anisotropic etching that forms a passivation layer on sidewalls of the first and second gate stacks, the passivation layer having a lower portion thinner than an upper portion. In some embodiments, the laterally etching of the bottom portions of the first and second gate stacks includes removing the lower portion of the passivation layer. In some embodiments, the patterning of the gate stack layer includes applying a plasma containing HBr and $O_2$. In some embodiments, the laterally etching of the bottom portions of the first and second gate stacks includes applying a plasma containing HBr. In some embodiments, the plasma containing HBr is free of $O_2$. In some embodiments, the structure having a semiconductor substrate and semiconductor fins protruding from the semiconductor substrate in both the first and second regions, and wherein the first and second channel regions are inside the semiconductor fins. In some embodiments, the first and second channel regions have a channel length ranging from about 16 nm to about 240 nm.

In another exemplary aspect, the present disclosure is directed to a method. The method includes providing a structure having a semiconductor substrate and semiconductor fins protruding from the semiconductor substrate in a first region and a second region, forming a gate material layer over the semiconductor fins, etching the gate material layer with a first etchant, thereby forming a first gate stack in the first region and a second gate stack in the second region, and etching the first and second gate stacks with a second etchant, the second etchant having different concentrations in the first and second regions, thereby forming the first and second gate stacks with bottom portions narrower than top portions. In some embodiments, the method further includes replacing the first and second gate stacks with respective first and second high-k metal gate stacks. In some embodiments, the first and second etchants have different material compositions. In some embodiments, the first etchant is a plasma containing HBr and $O_2$ and the second etchant is a plasma containing HBr. In some embodiments, the etching of the gate material layer includes a first plasma etching under a first pressure and a first RF power, and the etching of the first and second gate stacks includes a second plasma etching under a second pressure and a second RF power, the second pressure being higher than the first pressure and the second RF power being higher than the first RF power. In some embodiments, the second region is at a center of the structure and the first region is at an edge of the structure, and during the etching of the first and second gate stacks, the second etchant has a concentration about 5% to about 20% higher in the first region than in the second region. In some embodiments, the gate material layer includes polysilicon or silicon nitride.

In yet another exemplary aspect, the present disclosure is directed to a method of semiconductor device fabrication. The method includes providing a semiconductor wafer; forming a first plurality of fins in a center region of the semiconductor wafer and a second plurality of fins in an edge region of the semiconductor wafer; forming a dielectric layer over the first and second pluralities of fins; patterning the dielectric layer, thereby forming a first plurality of dummy gates on the first plurality of fins and a second plurality of dummy gates on the second plurality of fins; performing a dry etching process to the first and second pluralities of dummy gates by applying different etchant flow rates to the center and edge regions, thereby forming the first and second pluralities of dummy gates with bottom portions narrower than top portions; and replacing the first and second pluralities of dummy gates with respective first and second pluralities of metal gates, wherein the first and second pluralities of metal gates have bottom portions narrower than top portions. In some embodiments, the dry etching process is performed in a plasma processing chamber with multiple gas injectors having different etchant flow rate settings over the center region and the edge region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a structure having a first region and a second region, the first region including a first channel region, the second region including a second channel region;

forming a gate stack layer over the first and second regions;

patterning the gate stack layer, thereby forming a first gate stack over the first channel region and a second gate stack over the second channel region, wherein the patterning of the gate stack layer includes performing an anisotropic etching that forms a passivation layer on sidewalls of the first and second gate stacks, the passivation layer having a lower portion thinner than an upper portion; and laterally etching bottom portions of the first and second gate stacks by applying different etchant concentrations to the first and second regions simultaneously, thereby forming notches at the bottom portions of the first and second gate stacks.

2. The method of claim 1, wherein the applying of the different etchant concentrations includes applying different etchant flow rate settings to gas injectors over the first region and the second region in a plasma processing chamber.

3. The method of claim 1, wherein:
the structure is a semiconductor wafer;
the second region is a center region of the semiconductor wafer and the first region is a peripheral region of the semiconductor wafer; and
the peripheral region receives a higher etchant concentration than the center region during the laterally etching of the bottom portions of the first and second gate stacks.

4. The method of claim 3, wherein the peripheral region receives about 5% to about 20% higher etchant concentration than the center region during the laterally etching of the bottom portions of the first and second gate stacks.

5. The method of claim 1, wherein the laterally etching of the bottom portions of the first and second gate stacks includes removing the lower portion of the passivation layer.

6. The method of claim 1, wherein the patterning of the gate stack layer includes applying a plasma containing HBr and $O_2$.

7. The method of claim 1, wherein the laterally etching of the bottom portions of the first and second gate stacks includes applying a plasma containing HBr.

8. The method of claim 7, wherein the plasma containing HBr is free of $O_2$.

9. The method of claim 1, wherein the first and second channel regions have a channel length ranging from about 16 nm to about 240 nm.

10. A method, comprising:
providing a structure having a semiconductor substrate and semiconductor fins protruding from the semiconductor substrate in a first region and a second region;
forming a gate material layer over the semiconductor fins;
etching the gate material layer with a first etchant, thereby forming a first gate stack in the first region and a second gate stack in the second region; and
etching the first and second gate stacks with a second etchant, the second etchant having different concentrations in the first and second regions, thereby forming the first and second gate stacks with bottom portions narrower than top portions.

11. The method of claim 10, further comprising:
replacing the first and second gate stacks with respective first and second high-k metal gate stacks.

12. The method of claim 10, wherein the first and second etchants have different material compositions.

13. The method of claim 12, wherein the first etchant is a plasma containing HBr and $O_2$ and the second etchant is a plasma containing HBr.

14. The method of claim 10, wherein:
the etching of the gate material layer includes a first plasma etching under a first pressure and a first RF power; and
the etching of the first and second gate stacks includes a second plasma etching under a second pressure and a second RF power, wherein the second pressure is higher than the first pressure and the second RF power is higher than the first RF power.

15. The method of claim 10, wherein:
the second region is at a center of the structure and the first region is at an edge of the structure; and
during the etching of the first and second gate stacks, the second etchant has a concentration about 5% to about 20% higher in the first region than in the second region.

16. The method of claim 10, wherein the gate material layer includes polysilicon or silicon nitride.

17. A method of semiconductor device fabrication, comprising:
providing a semiconductor wafer;
forming a first plurality of fins in a center region of the semiconductor wafer and a second plurality of fins in an edge region of the semiconductor wafer;
forming a dielectric layer over the first and second pluralities of fins;
patterning the dielectric layer, thereby forming a first plurality of dummy gates on the first plurality of fins and a second plurality of dummy gates on the second plurality of fins;
performing a dry etching process to the first and second pluralities of dummy gates by applying different etchant flow rates to the center and edge regions, thereby forming the first and second pluralities of dummy gates with bottom portions narrower than top portions; and
replacing the first and second pluralities of dummy gates with respective first and second pluralities of metal gates, wherein the first and second pluralities of metal gates have bottom portions narrower than top portions.

18. The method of claim 17, wherein the dry etching process is performed in a plasma processing chamber with multiple gas injectors having different etchant flow rate settings over the center region and the edge region.

19. The method of claim 1, wherein the first and second channel regions are portions of FinFET devices.

20. The method of claim 1, further comprising:
replacing the first and second gate stacks with respective first and second high-k metal gate stacks.

* * * * *